(12) United States Patent　　(10) Patent No.: US 12,677,416 B2
Eom　　(45) Date of Patent: Jul. 7, 2026

(54) SEMICONDUCTOR MEMORY DEVICE WITH REDUCED STEPPED AREA

(71) Applicant: SK hynix Inc., Icheon-si (KR)

(72) Inventor: Dae Sung Eom, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 648 days.

(21) Appl. No.: 18/081,040

(22) Filed: Dec. 14, 2022

(65) Prior Publication Data

US 2024/0015966 A1　　Jan. 11, 2024

(30) Foreign Application Priority Data

Jul. 5, 2022　(KR) ........................ 10-2022-0082440

(51) Int. Cl.
H10B 43/27　　(2023.01)

(52) U.S. Cl.
CPC ................................... H10B 43/27 (2023.02)

(58) Field of Classification Search
CPC ........ H10B 53/00; H10B 53/10; H10B 53/20;
H10B 53/30; H10B 53/40; H10B 53/50;
H10B 41/00; H10B 41/10; H10B 41/20;
H10B 41/23; H10B 41/27; H10B 41/30;
H10B 41/35; H10B 41/40–44; H10B
41/46–50; H10B 41/60; H10B 41/70;
H10B 43/00; H10B 43/10; H10B 43/20;
H10B 43/23; H10B 43/27; H10B 43/30;
H10B 43/35; H10B 43/40; H10B 43/50;
H10B 51/00; H10B 51/10; H10B 51/20;
H10B 51/30; H10B 51/40; H10B 51/50
See application file for complete search history.

(56) References Cited

U.S. PATENT DOCUMENTS

| | | | |
|---|---|---|---|
| 2017/0141032 A1* | 5/2017 | Lee ...................... | H01L 23/5226 |
| 2017/0200676 A1* | 7/2017 | Jeong ..................... | G11C 5/025 |
| 2018/0053686 A1* | 2/2018 | Hyun ...................... | H10B 43/27 |
| 2018/0286743 A1* | 10/2018 | Chang ................. | H01L 23/5226 |
| 2020/0294850 A1* | 9/2020 | Lee ........................ | H10B 43/50 |
| 2021/0143169 A1 | 5/2021 | Lee | |
| 2021/0265268 A1* | 8/2021 | Su .......................... | H10B 43/10 |
| 2022/0139941 A1 | 5/2022 | Zhang et al. | |

FOREIGN PATENT DOCUMENTS

| | | |
|---|---|---|
| KR | 1020190014270 A | 2/2019 |
| KR | 1020190051694 A | 5/2019 |
| KR | 1020220045628 A | 4/2022 |

* cited by examiner

*Primary Examiner* — William B Partridge
*Assistant Examiner* — Gustavo G Ramallo
(74) *Attorney, Agent, or Firm* — WILLIAM PARK AND ASSOCIATES LTD.

(57)　　ABSTRACT

A semiconductor memory device includes a gate stack structure including a plurality of conductive layers stacked to be spaced apart from each other in a first direction, the gate stack structure surrounding the periphery of a polygonal opening. The semiconductor memory device also includes a stepped structure formed along a sidewall of the polygonal opening.

17 Claims, 24 Drawing Sheets

DPS

PST

SEMICONDUCTOR MEMORY DEVICE WITH REDUCED STEPPED AREA

CROSS-REFERENCE TO RELATED APPLICATION

The present application claims priority under 35 U.S.C. § 119(a) to Korean patent application number 10-2022-0082440, filed on Jul. 5, 2022, in the Korean Intellectual Property Office, the entire disclosure of which is incorporated herein by reference.

BACKGROUND

1. Technical Field

The present disclosure generally relates to a semiconductor memory device, and more particularly, to a three-dimensional semiconductor memory device.

2. Related Art

A semiconductor memory device includes a memory cell array and a peripheral circuit structure connected to the memory cell array. The memory cell array includes a plurality of memory cells capable of storing data. The peripheral circuit structure may supply various operating voltages to the memory cells, and control various operations of the memory cells.

A memory cell array of a three-dimensional semiconductor memory device may include a plurality of memory cells stacked in one direction. As the stacked number of memory cells is increased, the degree of integration of the three-dimensional semiconductor memory device may be improved, and the stacked number of conductive layers used as gate electrodes of the memory cells may be increased.

SUMMARY

In accordance with an embodiment of the present disclosure is a semiconductor memory device including: a gate stack structure including a cell array region, a first region adjacent to the cell array region, second and third regions which extend from the first region in a direction away from the cell array region and face each other, and a fourth region which faces the first region and connects the second region to the third region; a first sub-stepped structure disposed in the first region of the gate stack structure; a second sub-stepped structure disposed in the second region of the gate stack structure; a third sub-stepped structure disposed in the third region of the gate stack structure; and a fourth sub-stepped structure disposed in the fourth region of the gate stack structure, wherein the first, second, third, and fourth sub-stepped structures are disposed at different levels in a first direction.

In accordance with an embodiment of the present disclosure is a semiconductor memory device including: a first stack structure including a plurality of first conductive layers stacked to be spaced apart from each other in a first direction, the plurality of first conductive layers surrounding a first opening; a second stack structure including a plurality of second conductive layers stacked on the first stack structure to be spaced apart from each other in the first direction, the plurality of second conductive layers surrounding a second opening; a third stack structure including a plurality of third conductive layers stacked on the second stack structure to be spaced apart from each other in the first direction, the plurality of third conductive layers surrounding a third opening; and a fourth stack structure including a plurality of fourth conductive layers stacked on the third stack structure to be spaced apart from each other in the first direction, the plurality of fourth conductive layers surrounding a fourth opening, wherein each of the first, second, third, and fourth openings includes a stepped sidewall, a first sidewall facing the stepped sidewall, and second and third sidewalls which are disposed between the first sidewall and the stepped sidewall and face each other, and wherein a gradient of each of the first, second, and third sidewalls is greater than a gradient of the stepped sidewall.

In accordance with an embodiment of the present disclosure is a semiconductor memory device including: a gate stack structure including a plurality of conductive layers stacked to be spaced apart from each other in a first direction, the gate stack structure surrounding the periphery of a polygonal opening; and a stepped structure formed along a sidewall of the polygonal opening, wherein, from a planar viewpoint, the stepped structure becomes lower with decreasing distance to the center of the polygonal opening, and becomes lower clockwise or counterclockwise.

In accordance with an embodiment of the present disclosure is a semiconductor memory device including: a plurality of conductive layers stacked to be spaced apart from each other in a first direction, the plurality of conductive layers connected to a memory cell array, and a stepped structure including a plurality of end portions of the plurality of conductive layers, the stepped structure continuously extending to surround an opening, wherein the stepped structure includes a first sub-stepped structure and a second sub-stepped structure adjacent to each other clockwise, wherein the plurality of conductive layers include lower conductive layers stacked to be spaced apart from each other in the first direction and upper conductive layers stacked over the lower conductive layers to be spaced apart from each other in the first direction, wherein the first sub-stepped structure includes first end portions of the upper conductive layers, wherein the second sub-stepped structure includes second end portions of the lower conductive layers, and wherein the first end portions and the second end portions are disposed at different levels in the first direction

BRIEF DESCRIPTION OF THE DRAWINGS

Example embodiments will now be described more fully hereinafter with reference to the accompanying drawings; however, they may be embodied in different forms and should not be construed as being limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it may be the only element between the two elements, or one or more intervening elements may also be present. Like reference numerals refer to like elements throughout.

FIGS. 10A, 10B, 11, 12A, 12B, 12C, and 12D are views illustrating a manufacturing method of a stepped stack structure in accordance with embodiments of the present disclosure.

DETAILED DESCRIPTION

The specific structural and functional descriptions disclosed herein are merely illustrative for the purpose of describing embodiments according to the concept of the present disclosure. The embodiments according to the concept of the present disclosure can be modified in various forms and replaced with other equivalent embodiments. Thus, the present disclosure should not be construed as limited to the embodiments set forth herein.

It will be understood that, although the terms "first," "second," etc. may be used herein to describe various elements, these elements should not be limited by these terms. These terms are only used to distinguish one element from another element, and the order or number of components is not limited by the terms.

Embodiments provide a semiconductor memory device capable of improving a degree of integration.

Figure 1:
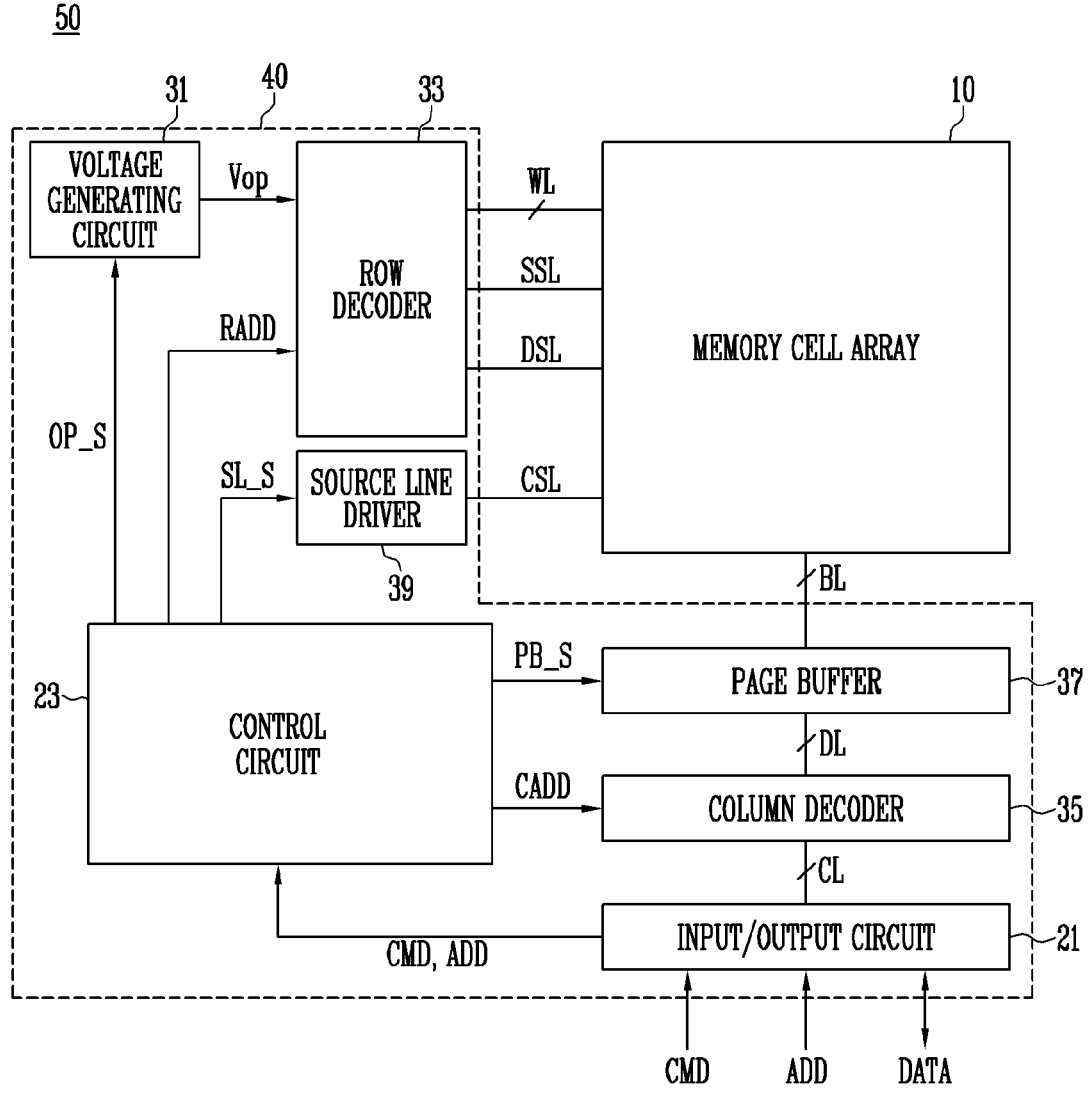
FIG. 1 is a block diagram illustrating a semiconductor memory device in accordance with an embodiment of the present disclosure.

FIG. 1 is a block diagram illustrating a semiconductor memory device in accordance with an embodiment of the present disclosure.

Referring to FIG. 1, the semiconductor memory device 50 may include a peripheral circuit structure 40 and a memory cell array 10.

The peripheral circuit structure 40 may be configured to perform a program operation for storing data in the memory cell array 10, a read operation for outputting data stored in the memory cell array 10, and an erase operation for erasing data stored in the memory cell array 10. In an embodiment, the peripheral circuit structure 40 may include an input/output circuit 21, a control circuit 23, a voltage generating circuit 31, a row decoder 33, a column decoder 35, a page buffer 37, and a source line driver 39.

The memory cell array 10 may include a plurality of memory cells which are three-dimensionally arranged. Each memory cell may be provided for a NAND flash memory device. Hereinafter, the embodiment of the present disclosure is described based on the memory cell array 10 of the NAND flash memory device, but the present disclosure is not limited thereto. In an embodiment, the memory cell array 10 may include a plurality of memory cells for a variable resistance memory device or a plurality of memory cells for a ferroelectric memory device.

The plurality of memory cells for the NAND flash memory device may form a plurality of memory cell strings. Each memory cell string may be connected to a drain select line DSL, a plurality of word lines WL, a source select line SSL, a plurality of bit lines BL, and a common source line CSL.

The input/output circuit 21 may transfer, to the control circuit 23, a command CMD and an address ADD, which received from an external device (e.g., a memory controller) of the semiconductor memory device 50. The input/output circuit 21 may exchange data DATA with the external device and the column decoder 35.

The control circuit 23 may output an operation signal OP_S, a row address RADD, a source line control signal SL_S, a page buffer control signal PB_S, and a column address CADD in response to the command CMD and the address ADD.

The voltage generating circuit 31 may generate various operating voltages Vop used for a program operation, a read operation, and an erase operation in response to the operation signal OP_S.

The row decoder 33 may transfer the operating voltages Vop to the drain select line DSL, the word lines WL, and the source select line SSL in response to the row address RADD.

The column decoder 35 may transmit data DATA input from the input/output circuit 21 to the page buffer 37 or transmit data DATA stored in the page buffer 37 to the input/output circuit 21 in response to the column address CADD. The column decoder 35 may exchange data DATA with the input/output circuit 21 through a column line CL. The column decoder 35 may exchange data DATA with the page buffer through a data line DL.

The page buffer 37 may temporarily store data DATA received through the bit line BL in response to the page buffer control signal PB_S. The page buffer 37 may sense a voltage or current of the bit line BL in a read operation.

The source line driver 39 may control a voltage applied to the common source line CSL in response to the source line control signal SL_S.

To improve the degree of integration of the semiconductor memory device, the memory cell array 10 may overlap with the peripheral circuit structure 40.

Figure 2A:
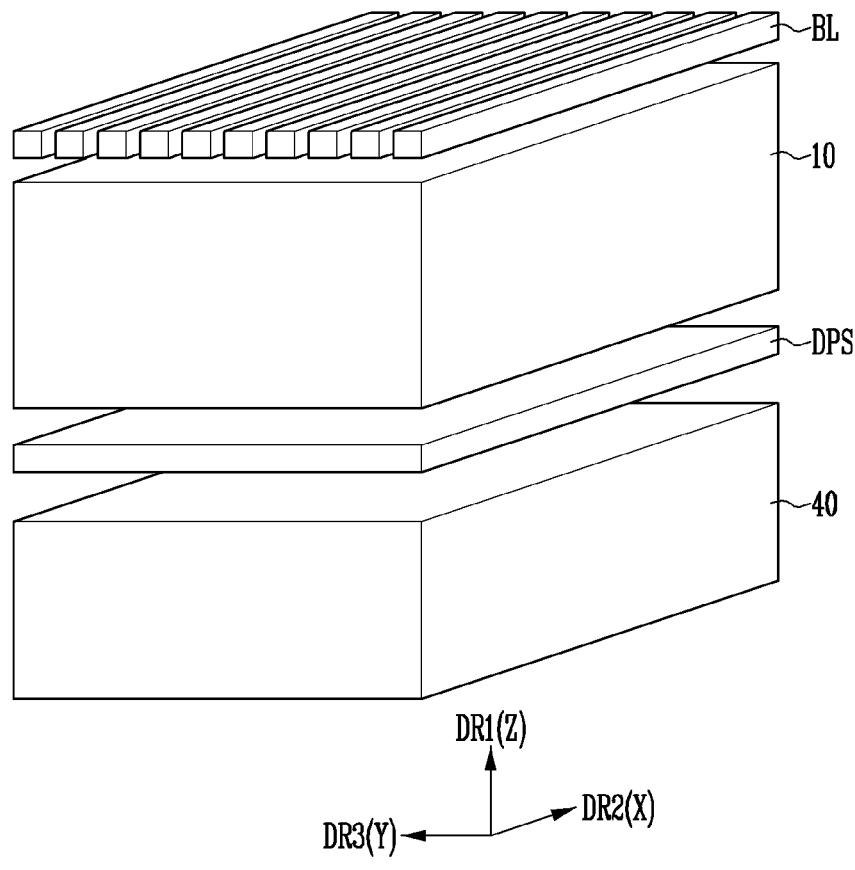
FIGS. 2A and 2B are views illustrating arrangements of a peripheral circuit structure, a memory cell array, a plurality of bit lines, and a doped semiconductor structure in accordance with embodiments of the present disclosure.
Figure 2B:
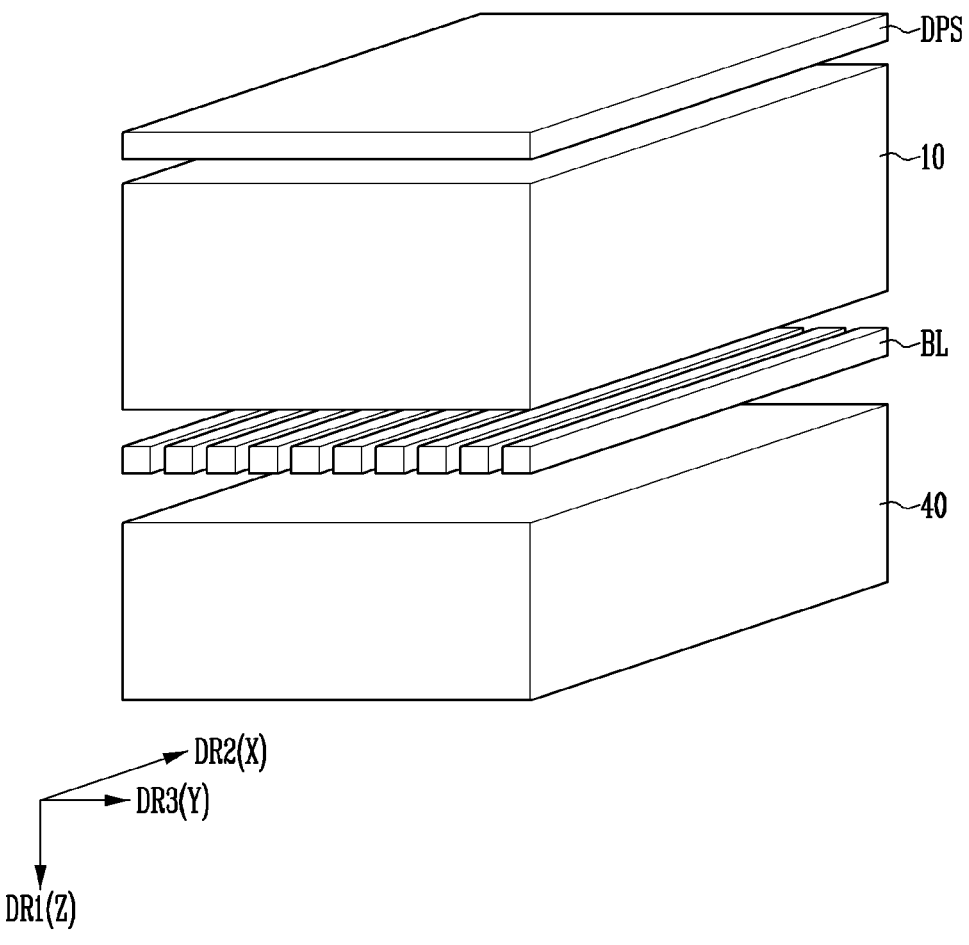

FIGS. 2A and 2B are views illustrating arrangements of a peripheral circuit structure, a memory cell array, a plurality of bit lines, and a doped semiconductor structure in accordance with embodiments of the present disclosure.

Referring to FIGS. 2A and 2B, a semiconductor memory device may include a doped semiconductor structure DPS, a memory cell array 10, and a plurality of bit lines BL. The doped semiconductor structure DPS may include at least one of an n-type impurity and a p-type impurity. The doped semiconductor structure DPS may include a surface facing the plurality of bit lines BL. Hereinafter, a direction in which the surface of the above-described doped semiconductor structure DPS faces the plurality of bit lines is defined as a first direction DR1. In an embodiment, the first direction DR1 may be a Z-axis direction.

The memory cell array 10 may be disposed between the plurality of bit lines BL and the doped semiconductor structure DPS.

Referring to FIG. 2A, a peripheral circuit structure 40 of the semiconductor memory device may be adjacent to the doped semiconductor structure DPS. Although not shown in the drawing, a plurality of interconnections may be disposed between the peripheral circuit structure 40 and the doped semiconductor structure DPS, or a plurality of interconnections and a plurality of conductive bonding pads may be disposed between the peripheral circuit structure 40 and the doped semiconductor structure DPS.

Referring to FIG. 2B, the peripheral circuit structure 40 of the semiconductor memory device may be adjacent to the plurality of bit lines BL. Although not shown in the drawing, a plurality of interconnections may be disposed between the peripheral circuit structure 40 and the plurality of bit lines BL, or a plurality of interconnections and a plurality of conductive bonding pads may be disposed between the peripheral circuit structure 40 and the plurality of bit lines BL.

Referring to FIGS. 2A and 2B, the doped semiconductor structure DPS, the memory cell array 10, and the plurality of bit lines BL may overlap with the peripheral circuit structure 40. From a planar viewpoint, the plurality of bit lines BL may extend in a second direction DR2, and be arranged in a third direction DR3. From a planar viewpoint, the second direction DR2 and the third direction DR3 may be defined as directions in which axes intersecting each other face. In an embodiment, the second direction DR2 may be an X-axis direction, and the third direction DR3 may be a Y-axis direction.

A process for forming the memory cell array 10 may be performed in various manners. In an embodiment, the process for forming the memory cell array 10 may be performed on the peripheral circuit structure 40. In another embodiment, a first structure including the memory cell array 10 may be formed separately from a second structure including the peripheral circuit structure 40. The first structure and the second structure may be bonded to each other through a plurality of conductive bonding pads.

The memory cell array 10 may be connected to the common source line CSL shown in FIG. 1 via the doped semiconductor structure DPS. The memory cell array 10 may be connected to the plurality of bit lines BL via a plurality of bit line connection structures. The memory cell array 10 may include a plurality of conductive layers stacked to be spaced apart from each other in the first direction DR1. The plurality of conductive layers may be provided as the plurality of word lines, the drain select line, and the source select line, which are described with reference to FIG. 1. The plurality of conductive layers of the memory cell array 10 may be connected to the peripheral circuit structure 40 via a plurality of conductive contacts and a plurality of conductive lines.

Figure 3:
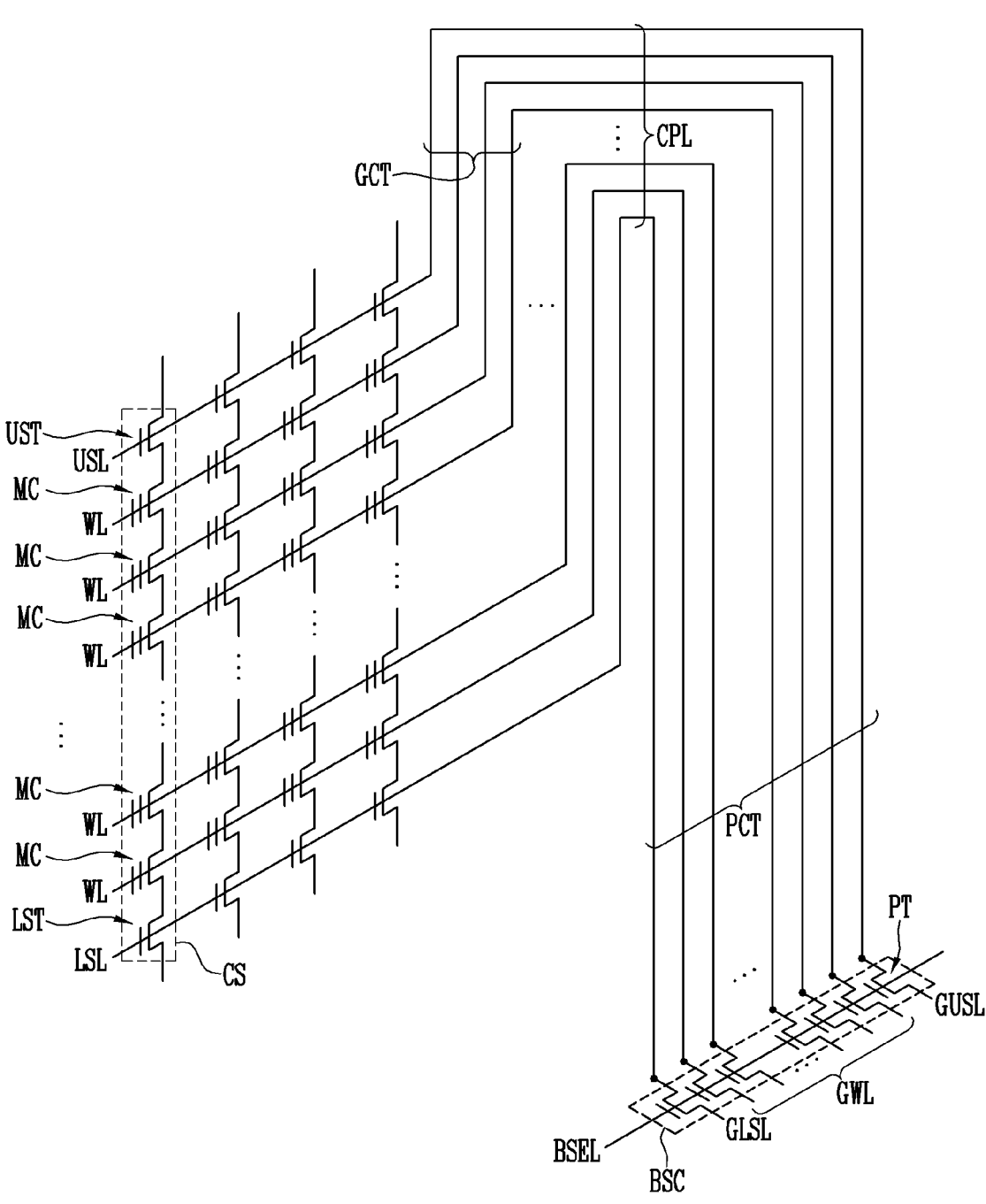
FIG. 3 is a circuit diagram illustrating a memory cell array and a block select circuit structure in accordance with an embodiment of the present disclosure.

FIG. 3 is a circuit diagram illustrating a memory cell array and a block select circuit structure in accordance with an embodiment of the present disclosure.

Referring to FIG. 3, a memory cell array may include a plurality of cell strings CS. Each memory cell string CS may include at least one lower select transistor LST, a plurality of memory cells MC, and at least one upper select transistor UST.

The plurality of memory cells MC may be connected in series between the lower select transistor LST and the upper select transistor UST. One of the lower select transistor LST and the upper select transistor UST may be used as a source select transistor, and the other of the lower select transistor LST and the upper select transistor UST may be used as a drain select transistor. The plurality of memory cells MC may be connected to the doped semiconductor structure DPS shown in FIG. 2A or 2B via the source select transistor. The plurality of memory cells MC may be connected to a corresponding bit line among the plurality of bit lines BL shown in FIG. 2A or 2B via the drain select transistor.

The plurality of memory cells MC may be respectively connected to a plurality of word lines WL. An operation of each memory cell MC may be controlled by a gate signal applied to a word line WL corresponding thereto. The lower select transistor LST may be connected to a lower select line LSL. An operation of the lower select transistor LST may be controlled by a gate signal applied to the lower select line LSL. The upper select transistor UST may be connected to an upper select line USL. An operation of the upper select transistor UST may be controlled by a gate signal applied to the upper select line USL.

The lower select line LSL, the upper select line USL, and the plurality of word lines WL may be connected to a block select circuit structure BSC. The block select circuit structure BSC may be included in the row decoder 33 described with reference to FIG. 1. In an embodiment, the block select circuit structure BSC may include a plurality of pass transistors PT respectively connected to the lower select line LSL, the upper select line USL, and the plurality of word lines WL. A plurality of gate electrodes of the plurality of pass transistors PT may be connected to a block select line BSEL. The plurality of pass transistors PT may be configured to transfer signals applied to a plurality of global lines GLSL, GUSL, and GWL to the lower select line LSL, the upper select line USL, and the plurality of word lines WL in response to a block select signal applied to the block select line BSEL.

The block select circuit structure BSC may be connected to the lower select line LSL, the upper select line USL, and the plurality of word lines WL via a plurality of conductive contacts GCT and PCT and a plurality of conductive lines CPL. The plurality of conductive contacts GCT and PCT may include a plurality of conductive gate contacts GCT and a plurality of conductive peripheral circuit contacts PCT. The plurality of conductive gate contacts GCT may be connected to the lower select line LSL, the upper select line USL, and the plurality of word lines WL. The plurality of conductive peripheral circuit contacts PCT may be connected to the block select circuit structure BSC of the peripheral circuit structure. The plurality of conductive lines CPL may be configured to connect the plurality of conductive gate contacts GCT to the plurality of conductive peripheral circuit contacts PCT.

The plurality of conductive gate contacts GCT described above may be connected to a plurality of conductive layers provided as the lower select line LSL, the upper select line USL, and the plurality of word lines WL. The plurality of conductive layers may be stacked to be spaced apart from each other in the first direction DR1 to form a gate stack structure. The plurality of conductive layers may be formed in a stepped structure to provide an area (landing area) which the plurality of conductive gate contacts GCT reach.

Figure 4:
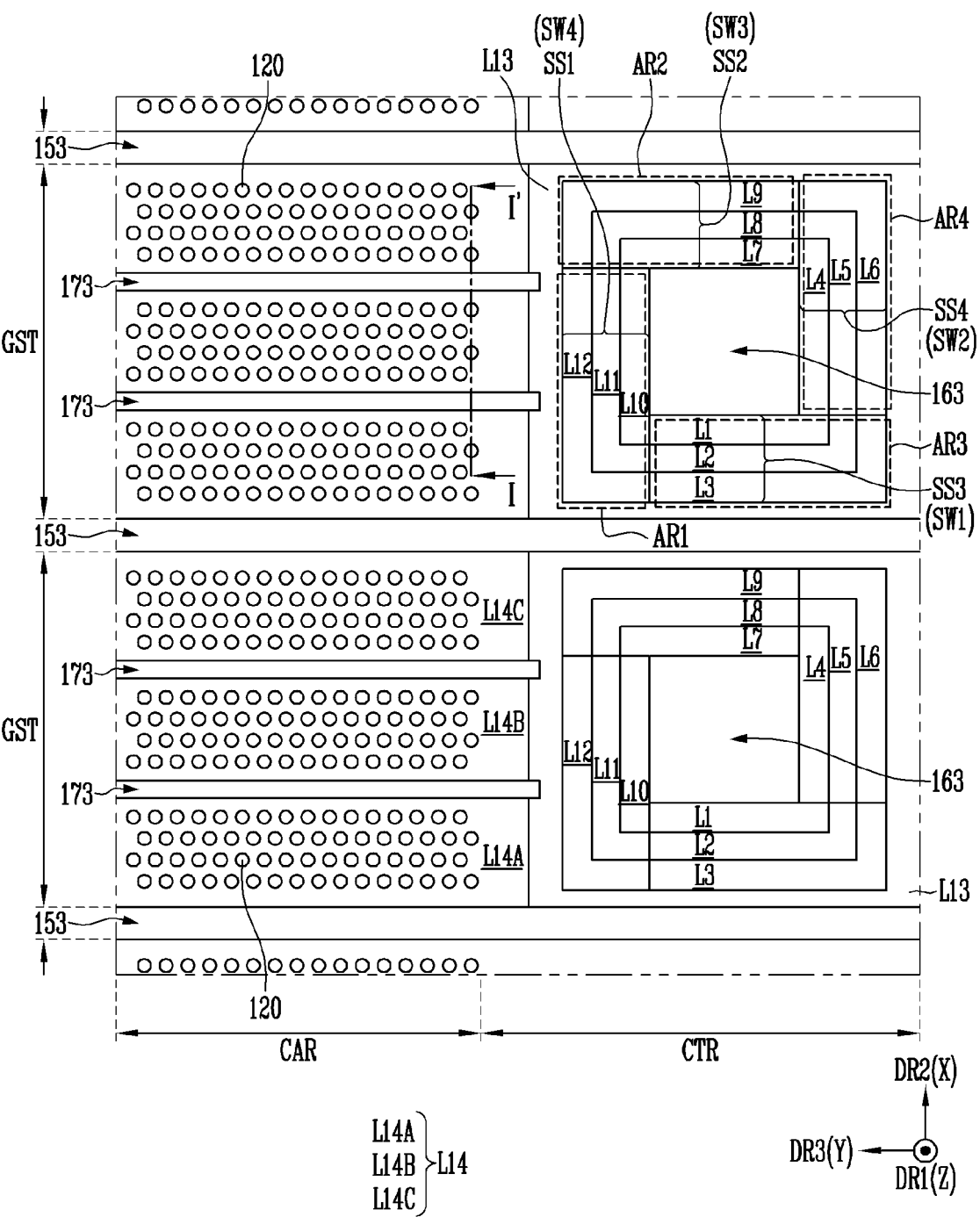
FIG. 4 is a plan view illustrating a gate stack structure of a semiconductor memory device in accordance with embodiments of the present disclosure.

FIG. 4 is a plan view illustrating a gate stack structure of a semiconductor memory device in accordance with embodiments of the present disclosure.

Referring to FIG. 4, the semiconductor memory device may include a plurality of gate stack structures GST partitioned by a slit 153. Each gate stack structure GST may include a cell array region CAR and a contact region CTR extending from the cell array region CAR.

The gate stack structure GST may include a plurality of horizontal layers L1 to L14 stacked in the first direction DR1. Each of the horizontal layers L1 to L14 may extend along the second direction DR2 and the third direction DR3 intersecting each other from a planar viewpoint.

Each of the horizontal layers L1 to L14 may extend from the cell array region CAR to the contact region CTR. The plurality of horizontal layers L1 to L14 may form a stepped structure in the contact region CTR.

The contact region CTR may include an opening 163. The gate stack structure GST in the contact region CTR may surround the periphery of the opening 163. The opening 163 may have a polygonal shape such as a triangular shape or a quadrangular shape from a planar viewpoint, and the contact region CTR may include at least three regions continuously arranged clockwise or counterclockwise. In an embodiment, the opening 163 may have a quadrangular shape from a planar viewpoint, and the contact region CTR may include a first region AR1, a second region AR2, a third region AR3, and a fourth region AR4. The first region AR1 may be adjacent to the cell array region CAR. The second region AR2 and the third region AR3 may extend from the first region AR1 in a direction away from the cell array region CAR and face each other. The fourth region AR4 may connect the second region AR2 and the third region AR3 to each other and face the first region AR1. Accordingly, it may be considered that the first region AR1, the second region AR2, the fourth region AR4, and the third region AR3 are continuously arranged while surrounding the periphery of the quadrangular opening 163 clockwise.

The gate stack structure GST may include a stepped structure surrounding the periphery of the opening 163. The stepped structure may have a step difference changed clockwise or counterclockwise along regions around the opening regions 163. The stepped structure may include at least three sub-stepped structures corresponding to the above-described at least three regions. Each sub-stepped structure may become lower as becoming closer to the center thereof. Hereinafter, the embodiment of the present disclosure will be described in detail, based on a case where the stepped structure includes first to fourth sub-stepped structures SS1 to SS4 respectively corresponding to the first to fourth regions AR1 to AR4 around the opening 163.

The first sub-stepped structure SS1 may be formed in the first region AR1, the second sub-stepped structure SS2 may be formed in the second region AR2, the third sub-stepped structure SS3 may be formed in the third region AR3, and the fourth sub-stepped structure SS4 may be formed in the fourth region AR4. Each of the first to fourth sub-stepped structures SS1 to SS4 may become lower as becoming closer to the center of the opening 163. More specifically, the first sub-stepped structure SS1 may become lower as becoming more distant from the cell array region CAR. The second sub-stepped structure SS2 may become lower as becoming closer to the third region AR3. The third sub-stepped structure SS3 may become lower as becoming closer to the second region AR2. The fourth sub-stepped structure SS4 may become lower as becoming closer to the first region AR1.

The opening 163 may include a stepped sidewall corresponding to each sub-stepped structure. In an embodiment, the opening 163 may include a first stepped sidewall SW1 corresponding to the third sub-stepped structure SS3, a second stepped sidewall SW2 corresponding to the fourth sub-stepped structure SS4, a third stepped sidewall SW3 corresponding to the second sub-stepped structure SS2, and a fourth stepped sidewall SW4 corresponding to the first sub-stepped structure SS1.

The first to fourth sub-stepped structures SS1 to SS4 or the first to fourth stepped sidewalls SW1 to SW4 may be located at different levels in the first direction DR1. Each of the first stepped sidewall SW1 and the third sub-stepped structure SS3 may be formed with a plurality of first horizontal layers L1, L2, and L3, and each of the second stepped sidewall SW2 and the fourth sub-stepped structure SS4 may be formed with a plurality of second horizontal layers L4, L5, and L6. Each of the third stepped sidewall SW3 and the second sub-stepped structure SS2 may be formed of a plurality of third horizontal layer L7, L8, and L9, and each of the fourth stepped sidewall SW4 and the first sub-stepped structure SS1 may be formed of a plurality of fourth horizontal layers L10, L11, and L12. The number of horizontal layers constituting each sub-stepped structure is not limited to the number shown in the drawing and may vary.

The plurality of horizontal layers may include the above-described first to fourth horizontal layers L1 to L12, and further include at least one horizontal layer disposed on the plurality of fourth horizontal layers L10, L11, and L12. In an embodiment, the plurality of horizontal layers may further include a fifth horizontal layer L13 and a sixth horizontal layer L14, which are stacked in the first direction DR1 on the plurality of fourth horizontal layers L10, L11, and L12. The sixth horizontal layer L14 may be isolated into two or more line structures L14A, L14B, and L14C by a line insulating structure 173. Each of the plurality of first to fourth horizontal layers L1 to L12 and the fifth horizontal layer L13 may continuously extend in the second direction DR2 and the third direction DR3 not to be penetrated by the line insulating structure 173 but to overlap with the two or more line structures L14A, L14B, and L14C. The fifth horizontal layer L13 may protrude laterally toward the contact region CTR as compared with the sixth horizontal layer 14, and surround the first to fourth regions AR1 to AR4 in the contact region CTR.

The plurality of horizontal layers L1 to L14 may extend to the contact region CTR from the cell array region CAR. The plurality of first horizontal layers L1, L2, and L3 may continuously extend to the first to fourth regions AR1 to AR4 from the cell array region CAR. The plurality of second horizontal layers L4, L5, and L6 may continuously extend to the first region AR1, the second region AR2, and the fourth region AR4 from the cell array region CAR. The plurality of third horizontal layers L7, L8, and L9 may continuously extend to the first region AR1 and the second region AR2 from the cell array region CAR. The plurality of fourth horizontal layers L10, L11, and L12 may continuously extend to the first region AR1 from the cell array region CAR.

The plurality of horizontal layers L1 to L14 in the cell array region CAR may be penetrated by a plurality of cell plugs 120 extending in the first direction DR1. The memory cell string CS shown in FIG. 3 may be defined along each cell plug 120.

Figure 5A:
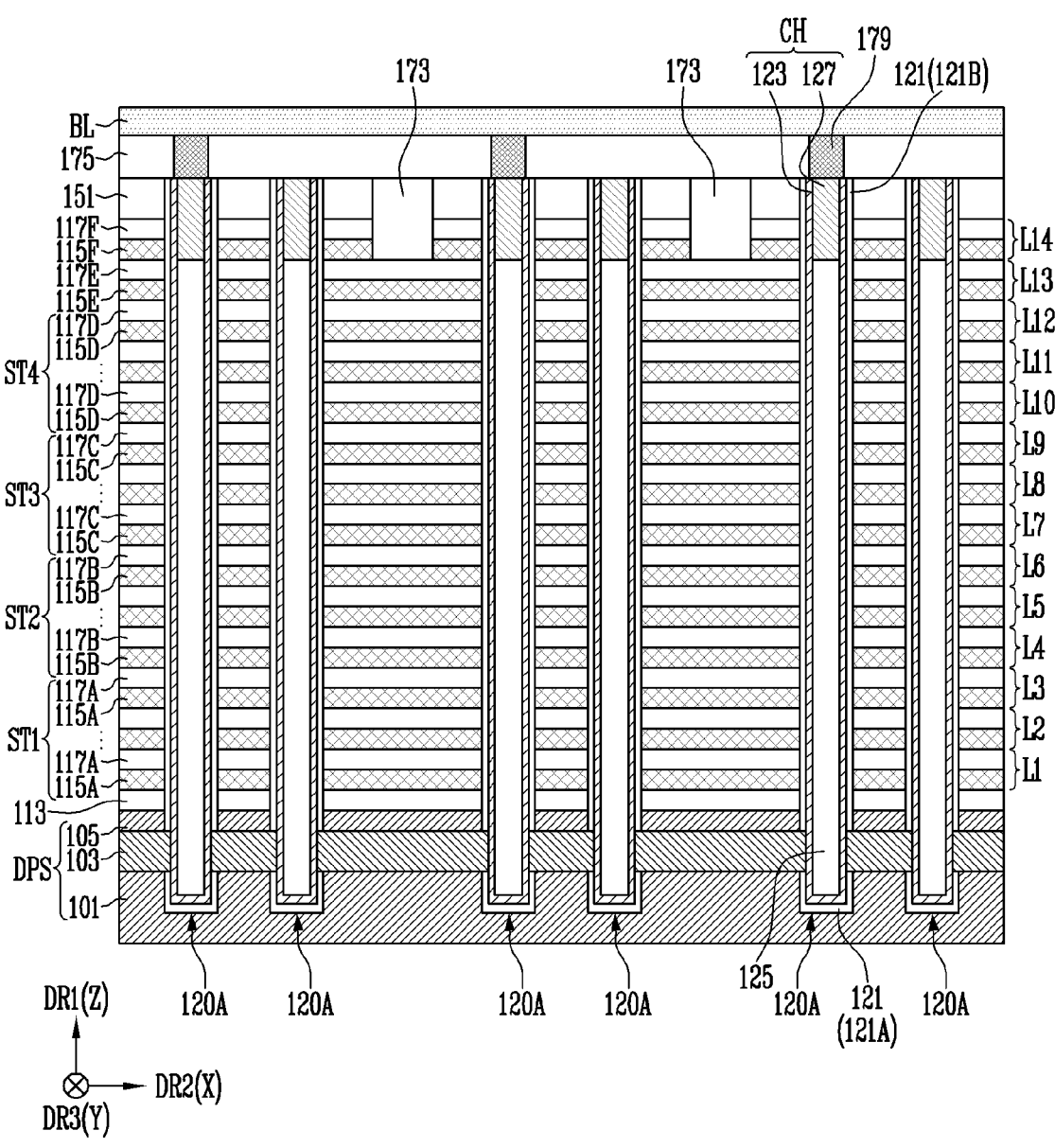
FIGS. 5A, 5B, and 5C are sectional views illustrating a semiconductor memory device in accordance with embodiments of the present disclosure.
Figure 5B:
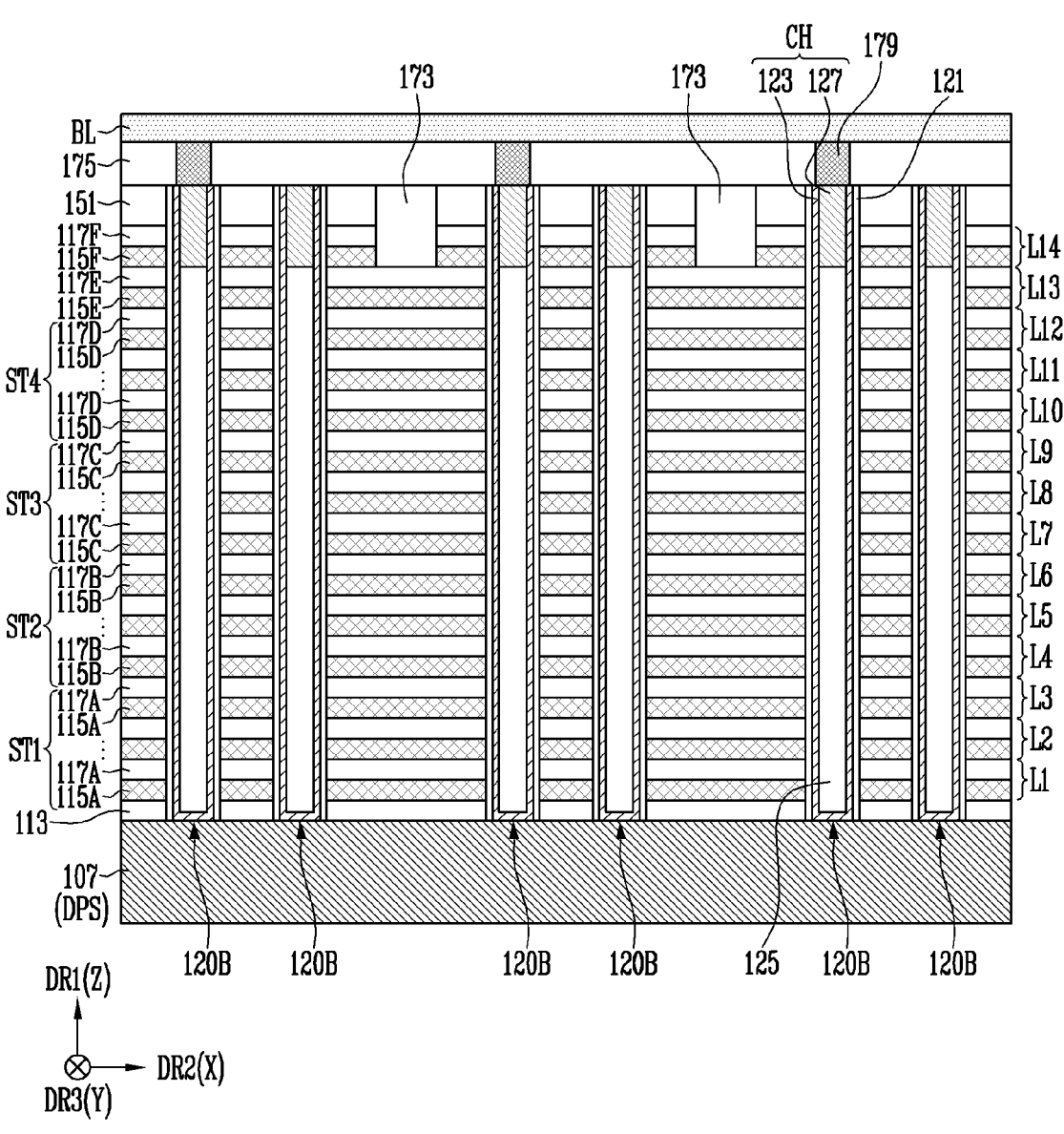
Figure 5C:
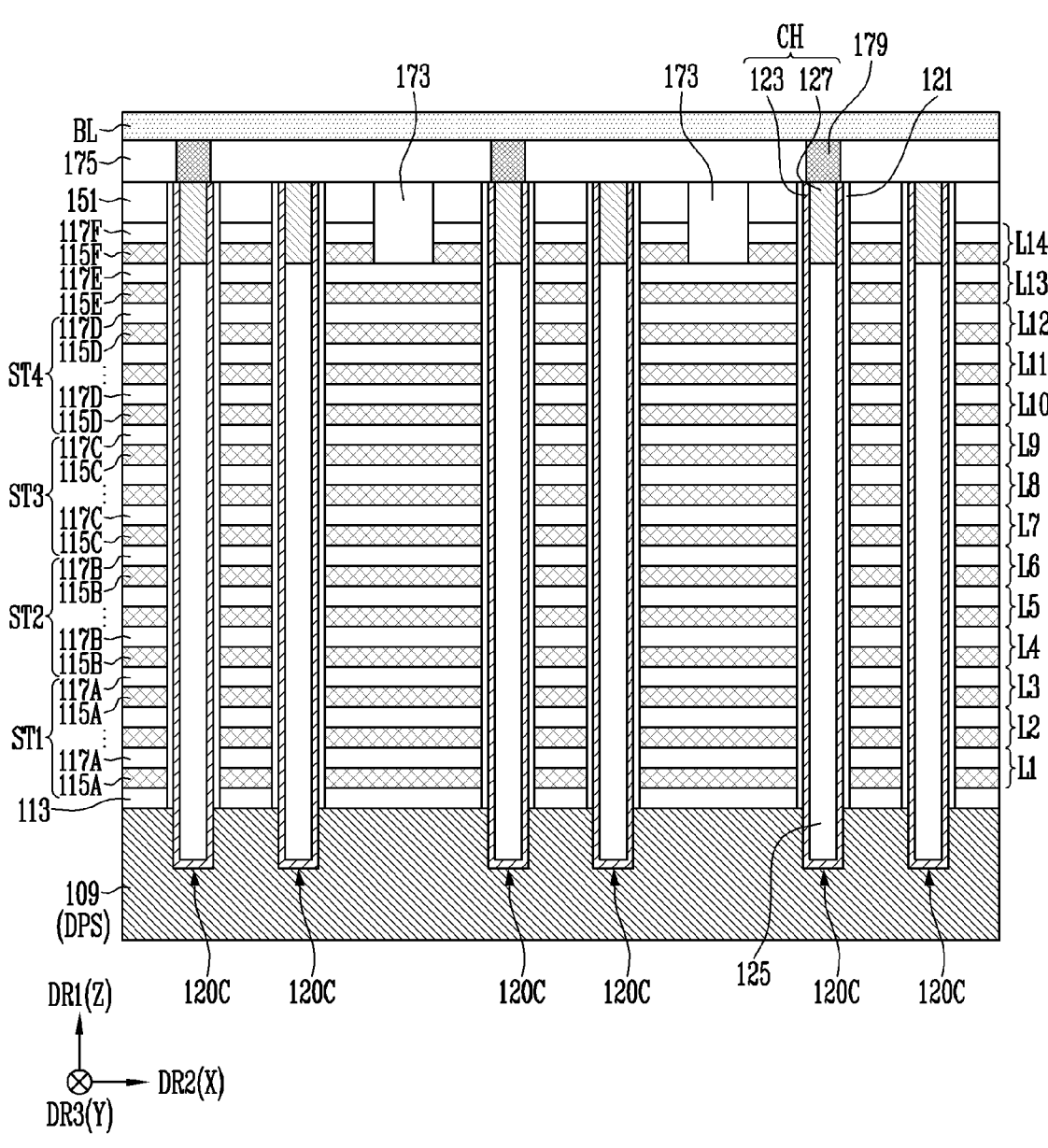

FIGS. 5A, 5B, and 5C are sectional views illustrating a semiconductor memory device in accordance with embodiments of the present disclosure. FIGS. 5A to 5C illustrate sectional views of the semiconductor memory device taken along line I-I' shown in FIG. 4. Hereinafter, repeated descriptions of components identical to the above-described components will be omitted.

Referring to FIGS. 5A to 5C, the semiconductor memory device may include a doped semiconductor structure DPS, a first insulating layer 113 on the doped semiconductor structure DPS, a plurality of horizontal layers L1 to L14 stacked on the first insulating layer 113, at least one interposition insulating layer 151 and 175 on the plurality of horizontal layers L1 to L14, and a bit line BL on the at least one interposition insulating layer 151 and 175. Hereinafter, the embodiments of the present disclosure are described based on an example in which the bit line BL is spaced apart from the plurality of horizontal layers L1 to L14 with a first interposition insulating layer 151 and a second interposition insulating layer 175 on the first interposition insulating layer 151, which are interposed therebetween, but the present disclosure is not limited thereto.

The doped semiconductor structure DPS may include at least one doped semiconductor layer.

Referring to FIG. 5A, the doped semiconductor structure DPS may include a first doped semiconductor layer 101, a second doped semiconductor layer 103, and a third doped semiconductor layer 105, which are stacked in the first direction DR1. Each of the first doped semiconductor layer 101, the second doped semiconductor layer 103, and the third doped semiconductor layer 105 may include at least one of an n-type impurity and a p-type impurity. In an embodiment, the first doped semiconductor layer 101, the second doped semiconductor layer 103, and the third doped semiconductor layer 105 may include an impurity of the same conductivity type as a majority carrier. In another embodiment, the first doped semiconductor layer 101 may include, as a majority carrier, an impurity of a conductivity type opposite to a conductivity type of the second doped semiconductor layer 103 and the third doped semiconductor layer 105.

Referring to FIGS. 5B and 5C, the doped semiconductor structure DPS may include a single doped semiconductor layer 107 or 109. The doped semiconductor layer 107 or 109 may include at least one of an n-type impurity and a p-type impurity. In an embodiment, the doped semiconductor layer 107 or 109 may include an n-type impurity as a majority carrier. In another embodiment, the doped semiconductor layer 107 or 109 may include a p-type impurity as a majority carrier. In still another embodiment, the doped semiconductor layer 107 or 109 may include a source region including an n-type impurity as a majority carrier and a well region including a p-type impurity as a majority carrier.

The first insulating layer 113 may extend in the second direction DR2 and the third direction DR3 to cover a surface of the doped semiconductor structure DPS, which faces in the first direction DR1.

The plurality of horizontal layers L1 to L14 may be stacked in the first direction DR1 on the first insulating layer 113. The plurality of horizontal layers L1 to L14 may be configured with a plurality of conductive layers 115A to 115F and a plurality of interlayer insulating layers 117A to 117F alternately disposed in the first direction DR1 with the plurality of conductive layers 115A to 115F. The plurality of conductive layers 115A to 115F may constitute a plurality of pairs with the plurality of interlayer insulating layers 117A to 117F. The plurality of pairs may respectively correspond to the plurality of horizontal layers. For example, a first horizontal layer L1 may be formed with a pair of a first conductive layer 115A and a first interlayer insulating layer 117, which correspond thereto.

A plurality of first conductive layers 115A and a plurality of first interlayer insulating layers 117A of a plurality of first horizontal layers L1, L2, and L3 may form a first stack structure ST1. The plurality of first conductive layers 115 of the first stack structure ST1 may be spaced apart from each other in the first direction DR1 by the first interlayer insulating layers 117A. A plurality of second conductive layers 115B and a plurality of second interlayer insulating layers 117B of a plurality of second horizontal layers L4, L5, and L6 may form a second stack structure ST2. The second stack structure ST2 may be disposed on the first stack structure ST1. The plurality of second conductive layers 115B may be spaced apart from each other in the first direction DR1 by the plurality of second interlayer insulating layers 117B. A plurality of third conductive layers 115C and a plurality of third interlayer insulating layers 117C of a plurality of third horizontal layers L7, L8, and L9 may form a third stack structure ST3. The third stack structure ST3 may be disposed on the second stack structure ST2. The plurality of third conductive layers 115C may be spaced apart from each other in the first direction DR1 by the plurality of third interlayer insulating layers 117C. A plurality of fourth conductive layers 115D and a plurality of fourth interlayer insulating layers 117D of a plurality of fourth horizontal layers L10, L11, and L12 may form a fourth stack structure ST4. The fourth stack structure ST4 may be disposed on the third stack structure ST3. A fifth horizontal layer L13 may include a fifth conductive layer 115E and a fifth interlayer insulating layer 117E, which are stacked on the fourth stack structure ST4, and a sixth horizontal layer L14 may include a sixth conductive layer 115F and a sixth interlayer insulating layer 117F, which are stacked on the fifth horizontal layer L13.

Among the first to sixth conductive layers 115A to 115F of the plurality of horizontal layers L1 to L14, at least one conductive layer adjacent to the doped semiconductor structure DPS may be provided as a source select line, at least one conductive layer adjacent to the bit line BL may be provided as a drain select line, and the other conductive layers may be provided as a plurality of word lines. In an embodiment, a lowermost first conductive layer adjacent to the doped semiconductor structure DPS among the plurality of first conductive layers 115A may be provided as a source select line, and the sixth conductive layer 115F may be provided as a drain select line. The line insulating structure 173 may penetrate the sixth conductive layer 115F to partition the drain select line.

A cell plug 120A, 120B, or 120C may penetrate the plurality of horizontal layers L1 to L14. The cell plug 120A, 120B, or 120C may include a channel structure CH and a memory layer 121 extending along a sidewall of the channel structure CH. The channel structure CH may include a channel layer 123 and a capping doped semiconductor pattern 127. The channel layer 123 may be provided as a channel of a memory cell string. The channel layer 123 may include a semiconductor material such as silicon, germanium, or any combination thereof. The channel layer 123 may be formed to have a hollow type. When the channel layer 123 is formed to have the hollow type, a central region of the channel layer 123 may be filled with a core insulating layer 125 and the capping doped semiconductor pattern 127. The capping doped semiconductor pattern 127 may fill a top end of the central region of the channel layer 123 on the core insulating layer 125. Although not shown in the drawings, the memory layer 121 may include a tunnel insulating layer surrounding an outer wall of the channel structure CH, a data storage layer surrounding an outer wall of the tunnel insulating layer, and a blocking insulating layer surrounding an outer wall of the data storage layer. The data storage layer may include a charge trap layer, a floating gate layer, a variable resistance layer, or a ferroelectric layer. In an embodiment, the data storage layer may be formed of a nitride layer in which charges can be trapped. The blocking insulating layer may include oxide capable of blocking charges, and the tunnel insulating layer may include silicon oxide through which charges can tunnel.

The cell plug 120A, 120B, or 120C may extend to penetrate the first interposition insulating layer 151. The second interposition insulating layer 175 may extend in the second direction DR2 and the third direction DR3 to cover the first interposition insulating layer 151 and the cell plug 120A, 120B, or 120C.

The bit line BL may be connected to the capping doped semiconductor pattern 127 of a cell plug 120A, 120B, or 120C corresponding thereto via a bit line connection structure 179 penetrating the second interposition insulating layer 175.

The doped semiconductor structure DPS may form a contact surface with the channel layer 123 of the cell plug 120A, 120B, or 120C in various manners.

Referring to FIG. 5A, the channel layer 123 of the cell plug 120A may penetrate the third doped semiconductor layer 105 of the doped semiconductor structure DPS, and extend to the inside of the first doped semiconductor layer 101. The channel layer 123 may extend along a surface of the core insulating layer 125, which faces in the opposite direction of the first direction DR1. The second doped semiconductor layer 103 may be in contact with a portion of a sidewall of the channel layer 123 between the first doped semiconductor layer 101 and the third doped semiconductor layer 105, and surround the portion of the sidewall of the channel layer 123. Accordingly, the contact surface between the doped semiconductor structure DPS and the channel layer 123 may be defined as the second doped semiconductor layer 103 and the portion of the sidewall of the channel layer 123 are in contact with each other. The memory layer 121 may be isolated into a first memory pattern 121A and a second memory pattern 121B by the second doped semiconductor layer 103. The first memory pattern 121A may be disposed between the channel layer 123 and the first doped semiconductor layer 101, and the second memory pattern 121B may extend in the first direction DR1 along the sidewall of the channel layer 123 from between the channel layer 123 and the third doped semiconductor layer 105.

Referring to FIG. 5B, the channel layer 123 of the cell plug 120B may be in contact with the surface of the doped semiconductor structure DPS, which faces in the first direction DR1. The channel layer 123 may extend between the doped semiconductor structure DPS and the core insulating layer 125 to have a closed end portion facing the doped semiconductor structure DPS. Accordingly, the contact surface between the doped semiconductor structure DPS and the channel layer 123 may be defined as the closed end portion of the channel layer 123 and the doped semiconductor structure DPS are in contact with each other.

Although not shown in the drawing, an epitaxial lower channel layer may be additionally disposed between the channel layer 123 and the doped semiconductor structure DPS. The epitaxial lower channel layer and the doped semiconductor structure DPS may be in contact with each other, and the channel layer 123 may be connected to the doped semiconductor structure DPS via the epitaxial lower channel layer.

Referring to FIG. 5C, the channel layer 123 of the cell plug 120C may extend to the inside of the doped semiconductor structure DPS. The channel layer 123 may extend to be interposed between the core insulating layer 125 and the doped semiconductor structure DPS. The channel layer 123 may include a protrusion part protruding to the inside of the doped semiconductor structure DPS as compared with the memory layer 121. The protrusion part of the channel layer 123 may form a contact surface with the doped semiconductor structure DPS.

The memory cell string CS described with reference to FIG. 3 may be defined along the channel layer 123 shown in FIGS. 5A to 5C. Specifically, a source select transistor may be formed at an intersection portion of a conductive layer (e.g., a lowermost layer 115A) provided as a source select line among the first to sixth conductive layers 115A to 115F shown in FIGS. 5A to 5C and the channel layer 123, and a drain select transistor may be formed at an intersection portion of a conductive layer (e.g., 115F) provided as a drain select line among the first to sixth conductive layers 115A to 115F shown in FIGS. 5A to 5C and the channel layer 123. In addition, a plurality of memory cells may be formed at intersection portions of a plurality of conductive layers (e.g., 115B to 115E) provided as a plurality of word lines among the first to sixth conductive layers 115A to 115F shown in FIGS. 5A to 5C and the channel layer 123. The source select transistor, the plurality of memory cells, and the drain select transistor, which are described above, may be connected in series by the channel layer 123 shown in FIGS. 5A to 5C to form the memory cell string CS shown in FIG. 3.

Figure 6:
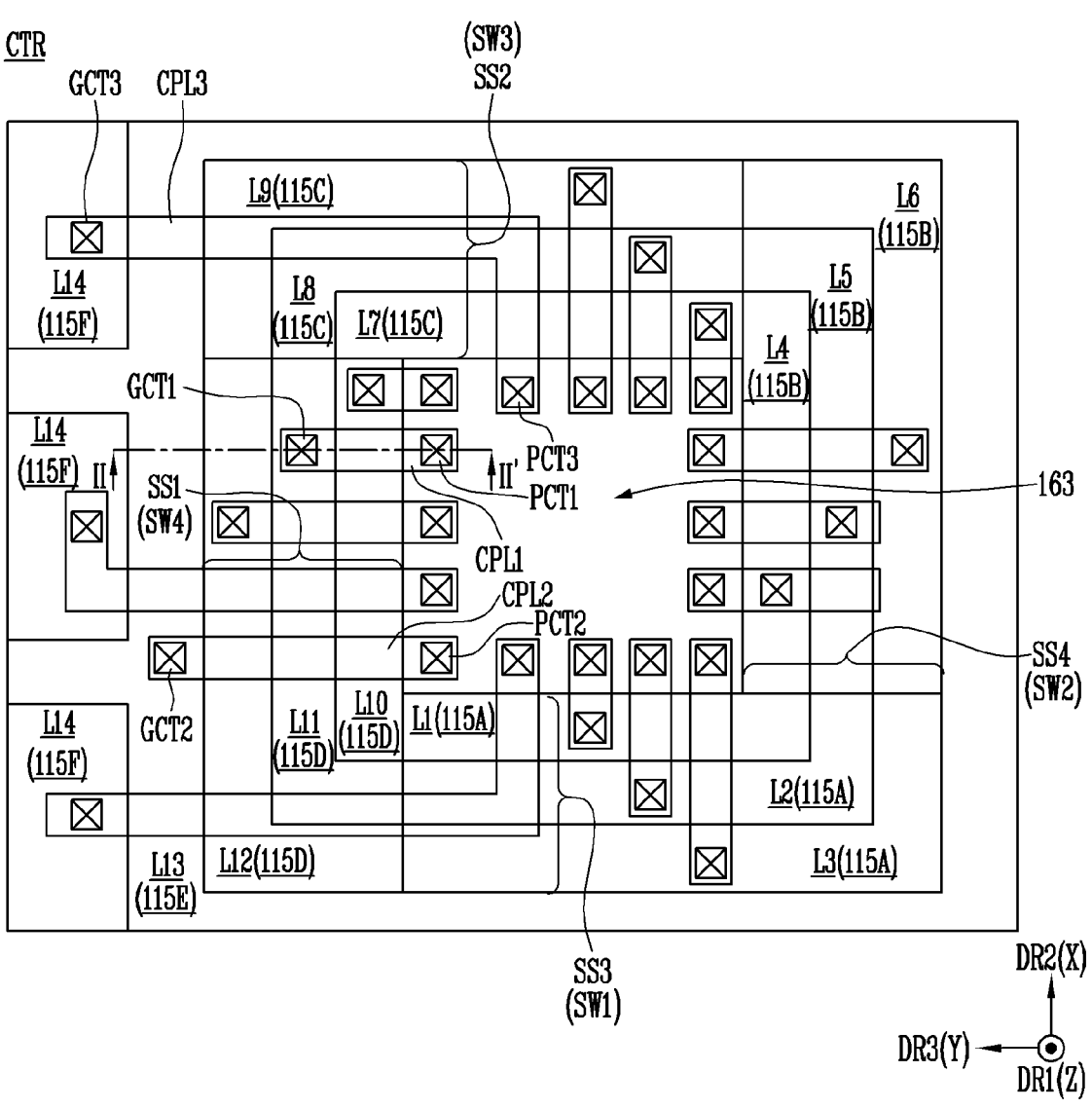
FIG. 6 is a plan view illustrating a connection structure of a semiconductor memory device in accordance with embodiments of the present disclosure.

FIG. 6 is a plan view illustrating a connection structure of a semiconductor memory device in accordance with embodiments of the present disclosure. Hereinafter, repeated descriptions of components identical to the above-described components will be omitted.

Referring to FIG. 6, a plurality of conductive layers 115A to 115F corresponding to a plurality of horizontal layers L1 to L14 may include an end portion disposed in a contact region CTR. The end portion of the plurality of conductive layers 115A to 115F may form a stepped structure in the contact region CTR.

An end portion of a plurality of first conductive layers 115A, an end portion of a plurality of second conductive layers 115B, an end portion of a plurality of third conductive layers 115C, and an end portion of a plurality of fourth conductive layers 115D may form first to fourth sub-stepped structures SS1 to SS4 as described with reference to FIG. 4. Specifically, the third sub-stepped structure SS3 corresponding to a first stepped sidewall SW1 of an opening 163 may be formed by the end portion of the plurality of first conductive layers 115A, and the fourth sub-stepped structure SS4 corresponding to a second stepped sidewall SW2 of the opening 163 may be formed by the end portion of the plurality of second conductive layers 115B. In addition, the second sub-stepped structure SS2 corresponding to a third stepped sidewall SW3 of the opening 163 may be formed by the end portion of the plurality of third conductive layers 115C, and the first sub-stepped structure SS1 corresponding to a fourth stepped sidewall SW4 of the opening 163 may be formed by the end portion of the plurality of fourth conductive layers 115D.

A fifth conductive layer 115E and a sixth conductive layer 115F do not overlap with the first to fourth sub-stepped structures SS1 to SS4 in the contact region CTR, and may include an end portion exposed by the stepped structure.

A plurality of conductive gate contacts GCT1, GCT2, and GCT3 may be connected to the end portion of the above-described plurality of conductive layers 115A to 115F. The plurality of conductive gate contacts GCT1, GCT2, and GCT3 may extend in the first direction DR1 from the end portion of the plurality of conductive layers 115A to 115F.

The plurality of conductive gate contacts GCT1, GCT2, and GCT3 may be connected to a plurality of conductive peripheral circuit contacts PCT1, PCT2, and PCT3 through a plurality of conductive lines CPL1, CPL2, and CPL3. The plurality of conductive peripheral circuit contacts PCT1, PCT2, and PCT3 may be disposed in the opening 163, and extend in the first direction DR1.

The plurality of conductive gate contacts GCT1, GCT2, and GCT3 may include a plurality of first conductive gate contacts GCT1, a second conductive gate contact GCT2, and a third conductive gate contact GCT3. The plurality of first conductive gate contacts GCT1 may extend in the first direction DR1 from the first to fourth conductive layers 115A to 115D of the first to fourth sub-stepped structures SS1 to SS4. The second conductive gate contact GCT2 may extend in the first direction DR1 from the fifth conductive layer 115E. The third conductive gate contact GCT3 may extend in the first direction DR1 from the sixth conductive layer 115F.

The plurality of conductive lines CPL1, CPL2, and CPL3 may include a plurality of first conductive lines CPL1 corresponding to the plurality of first conductive gate contacts GCT1, a second conductive line CPL2 corresponding to the second conductive gate contact GCT2, and a third conductive line CPL3 corresponding to the third conductive gate contact GCT3. The plurality of conductive peripheral circuit contacts PCT1, PCT2, and PCT3 may include a plurality of first conductive peripheral circuit contacts PCT1 corresponding to the plurality of first conductive lines CPL1, a second conductive peripheral circuit contact PCT2 corresponding to the second conductive line CPL2, and a third conductive peripheral circuit contact PCT3 corresponding to the third conductive line CPL3.

A stepped structure having a step difference changed clockwise or counterclockwise may be defined by the first to fourth sub-stepped structures SS1 to SS4 in accordance with the embodiments of the present disclosure. In addition, a plurality of first to fourth horizontal layers L1 to L12 may be continuous toward the cell array region CAR shown in FIG. 4 from the end portions defining the first to fourth sub-stepped structures SS1 to SS4. The arrangement efficiency of the plurality of first conductive gate contacts GCT1, the plurality of first conductive peripheral circuit contacts PCT1, and the plurality of first conductive lines CPL1 per area may be improved by the above-described first to fourth sub-stepped structures SS1 to SS4.

Figure 7:
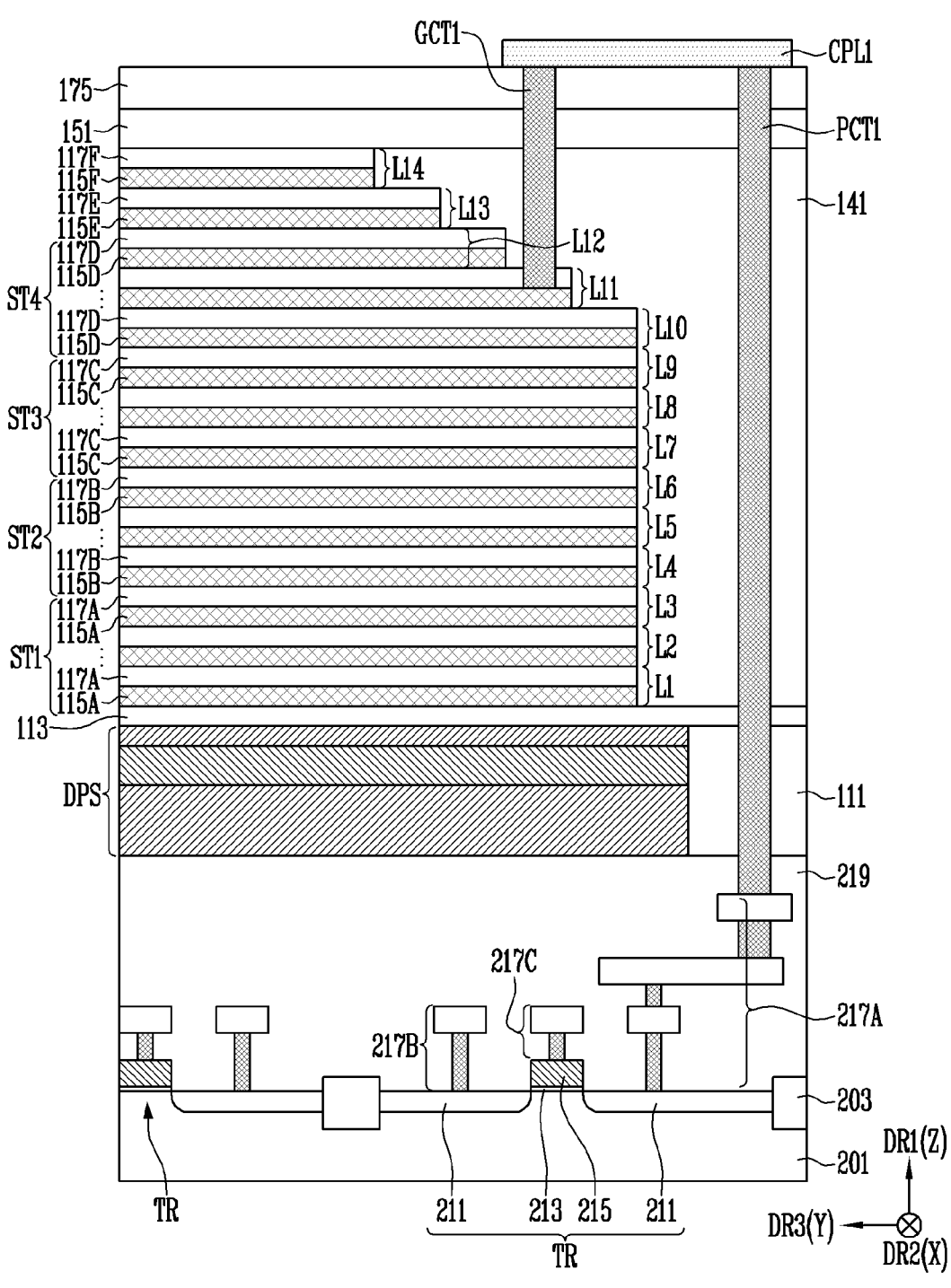
FIG. 7 is a sectional view illustrating a semiconductor memory device taken along line II-II' shown in FIG. 6 in accordance with embodiments of the present disclosure.

FIG. 7 is a sectional view illustrating a semiconductor memory device taken along line II-II' shown in FIG. 6 in accordance with embodiments of the present disclosure. Hereinafter, repeated descriptions of components identical to the above-described components will be omitted.

Referring to FIG. 7, a plurality of horizontal layers L1 to L14 on a first insulating layer 113 may form a stepped structure, and the stepped structure may be covered with a filling insulating layer 141. The filling insulating layer 141 may be formed to fill the opening 163 shown in FIG. 6, and a surface of the filling insulating layer 141 may be planarized. A first interposition insulating layer 151 and a second interposition insulating layer 175 may extend to overlap with the filling insulating layer 141.

Each of a plurality of conductive gate contacts may extend in the first direction DR1 from a conductive layer corresponding thereto among a plurality of conductive layers 115A to 115F, and penetrate an interlayer insulating layer corresponding thereto among a plurality of interlayer insulating layers 117A to 117F, the filling insulating layer 141, the first interposition insulating layer 151, and the second interposition insulating layer 175. For example, a first conductive gate contact GCT1 may extend in the first direction DR1 from a conductive layer (e.g., 115D) corresponding thereto among a plurality of first to fourth conductive layers 115A to 115D of first to fourth stack structures ST1 to ST4, and penetrate an interlayer insulating layer (e.g., 117D) corresponding thereto among a plurality of first to fourth interlayer insulating layers 117A to 117D of the first to fourth stack structures ST1 to ST4.

The semiconductor memory device may include a peripheral circuit structure overlapping with a doped semiconductor structure DPS. The peripheral circuit structure may include a plurality of transistors TR. The plurality of transistors TR may include the pass transistor PT of the block select circuit structure BSC shown in FIG. 3.

Each of the plurality of transistors TR may include a gate insulating layer 213 and a gate electrode 215, which are stacked on an active region of a semiconductor substrate 201, and include junctions 211 formed in the active region at both sides of the gate electrode 215. The semiconductor substrate 201 may extend in the second direction DR2 and the third direction DR3. The active region of the semiconductor substrate 201 may be partitioned by an isolation layer 203. The junctions 211 are regions defined by implanting at least one of an n-type impurity and a p-type impurity into the active region of the semiconductor substrate 201, and may be provided as a source region and a drain region.

An insulating structure 219 may be disposed between the plurality of transistors TR and the doped semiconductor structure DPS. The doped semiconductor structure DPS may be insulated from the plurality of transistors TR by the insulating structure 219.

The insulating structure 219 may include multi-layered insulating layers. First to third connection structures 217A to 217C connected to each transistor TR may be buried inside the insulating structure 219. Each of the first third connection structures 217A to 217C may be configured with conductive patterns having various structures. The first and second connection structures 217A and 217B may be respectively connected to the junctions 211 of the transistor TR, and the third connection structure 217C may be connected to the gate electrode 215 of the transistor TR.

The doped semiconductor structure DPS may be partitioned by a source insulating layer 111. The source insulating layer 111 may be disposed at the substantially same level as the doped semiconductor structure DPS.

The plurality of conductive peripheral circuit contacts may extend in the first direction DR1 from a connection structure corresponding thereto among the first to third connection structures 217A to 217C, and penetrate the insulating structure 219, the source insulating layer 111, the first insulating layer 113, the filling insulating layer 141, the first interposition insulating layer 151, and the second interposition insulating layer 175. For example, a first conductive peripheral circuit contact PCT1 may extend in the first direction DR1 from the first connection structure 217A connected to the pass transistor of the block select circuit structure among the plurality of transistors TR.

Each of a plurality of conductive lines may be disposed on the second interposition insulating layer 175, and connect a conductive gate contact corresponding thereto and a conductive peripheral circuit contact to each other. For example, a first conductive line CPL1 may connect the first conductive gate contact GCT1 and the first conductive peripheral circuit contact PCT1 to each other.

Figure 8:
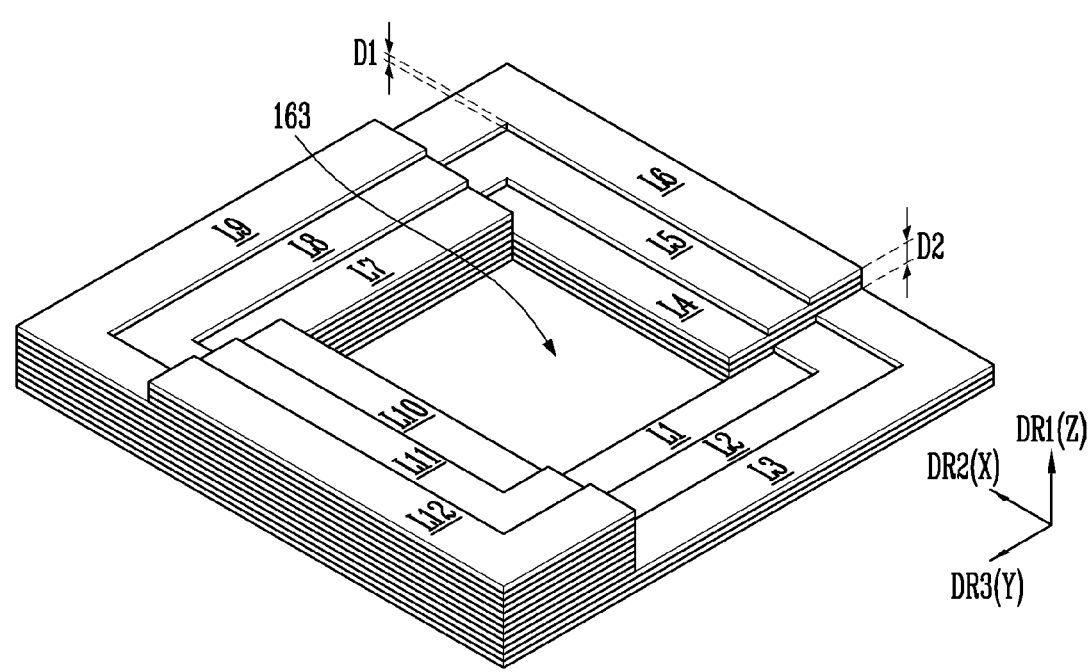
FIG. 8 is a perspective view illustrating a contact region of a gate stack structure in accordance with embodiments of the present disclosure.

FIG. 8 is a perspective view illustrating a contact region of a gate stack structure in accordance with embodiments of the present disclosure. Hereinafter, repeated descriptions of components identical to the above-described components will be omitted.

Referring to FIG. 8, a plurality of first to fourth horizontal lines L1 to L12 may be divided into 4N (N is a natural number equal to or greater than 2) horizontal layers, and each of a plurality of first horizontal layers L1, L2, and L3, a plurality of second horizontal layers L4, L5, and L6, a plurality of third horizontal layers L7, L8, and L9, and a plurality of fourth horizontal layers L10, L11, and L12 may be equally configured with N horizontal layers. For example, the plurality of first horizontal layers L1, L2, and L3 may be configured with three horizontal layers, and the plurality of first to fourth horizontal layers L1 to L12 may be configured with twelve horizontal layers.

The plurality of first horizontal layers L1, L2, and L3, the plurality of second horizontal layers L4, L5, and L6, the plurality of third horizontal layers L7, L8, and L9, and the plurality of fourth horizontal layers L10, L11, and L12 may define a first step difference changed toward the center of an opening 163 and a second step difference D2 changed clockwise or counterclockwise. The second step difference D2 may be greater than the first step difference D1. In an embodiment, the first step difference D1 may correspond to only a thickness of each horizontal layer in the first direction DR1, and the second step difference D2 may correspond to a total thickness of N horizontal layers in the first direction DR1.

Figure 9A:
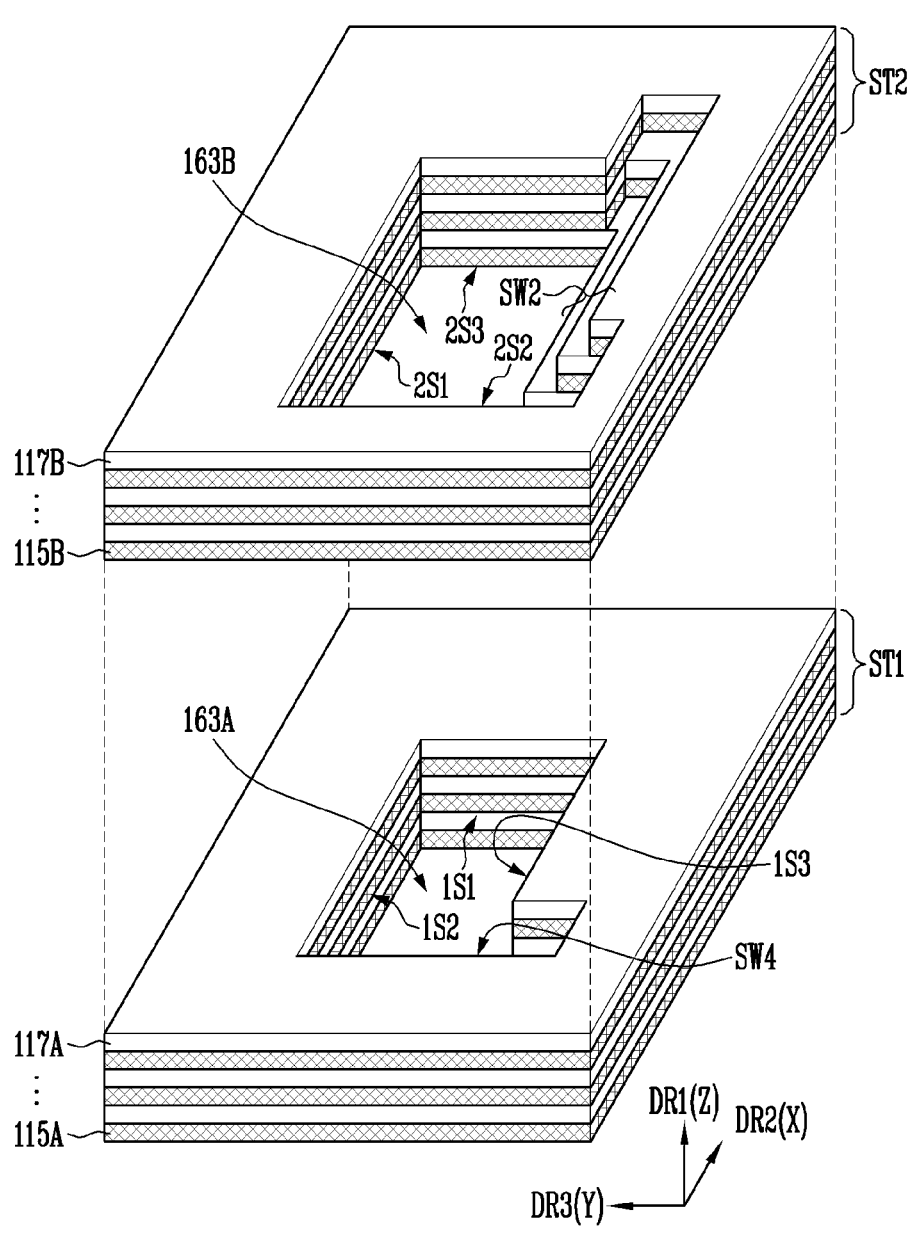
FIGS. 9A and 9B are exploded perspective views illustrating a contact region of a gate stack structure in accordance with embodiments of the present disclosure.
Figure 9B:
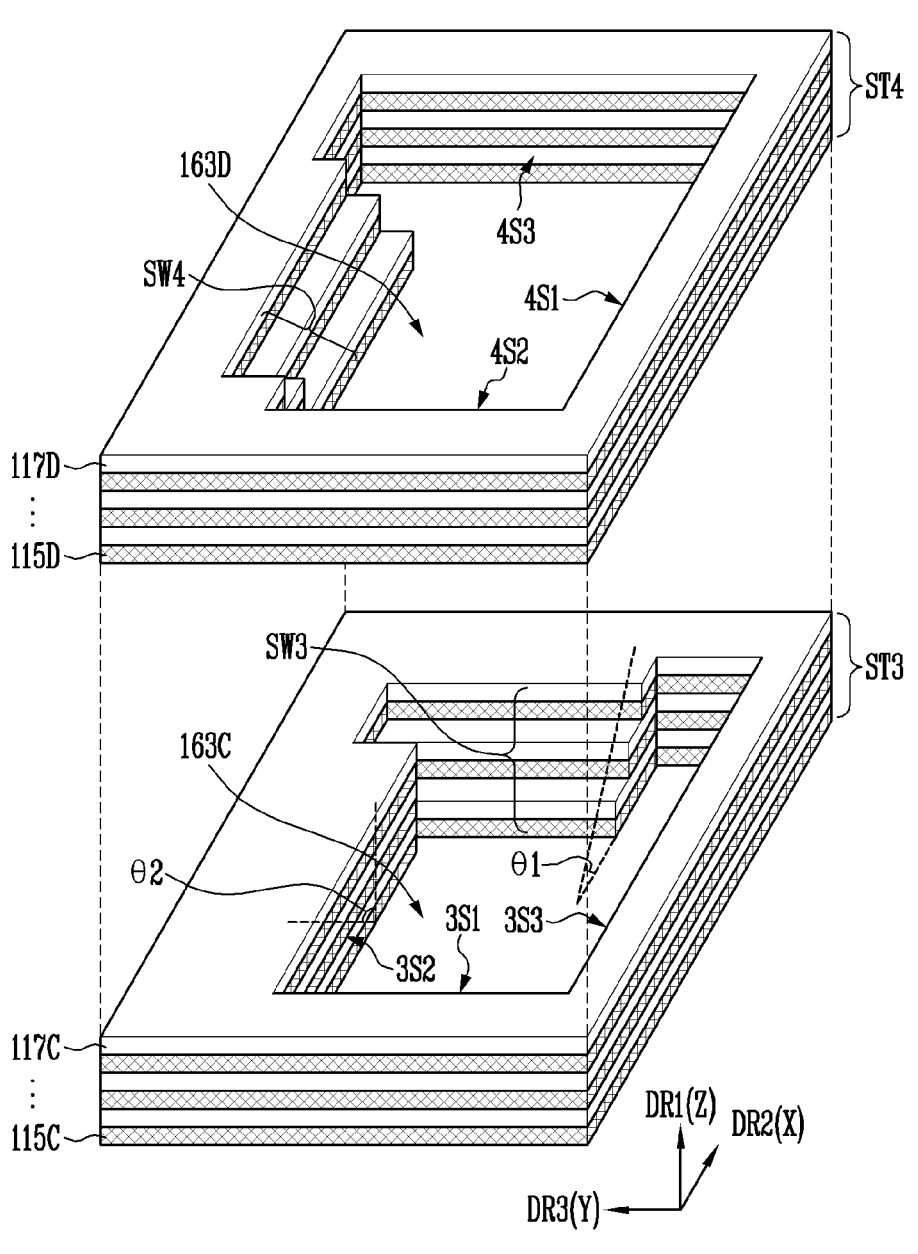

FIGS. 9A and 9B are exploded perspective views illustrating a contact region of a gate stack structure in accordance with embodiments of the present disclosure. Hereinafter, repeated descriptions of components identical to the above-described components will be omitted.

Referring to FIGS. 9A and 9B, a plurality of first conductive layers 115A and a plurality of first interlayer insulating layers 117A of a first stack structure ST1 may surround a first opening 163A, and a plurality of second conductive layers 115B and a plurality of second interlayer insulating layers 117B of a second stack structure ST2 may surround a second opening 163B. In addition, a plurality of third conductive layers 115C and a plurality of third interlayer insulating layers 117C of a third stack structure ST3 may surround a third opening 163C, and a plurality of fourth conductive layers 115D and a plurality of fourth interlayer insulating layers 117D of a fourth stack structure ST4 may surround a fourth opening 163D.

The first to fourth openings 163A to 163D may be connected to each other to form the opening 163 shown in FIG. 8. Each of the first to fourth openings 163A to 163D may include a stepped sidewall SW1, SW2, SW3, or SW4, a first sidewall 1S1, 2S1, 3S1, or 4S1, a second sidewall 1S2, 2S2, 3S2, or 4S2, and a third sidewall 1S3, 2S3, 3S3, or 4S3.

The stepped sidewall may include a first stepped sidewall SW1 of the first opening 163A, a second stepped sidewall SW2 of the second opening 163B, a third stepped sidewall SW3 of the third opening 163C, and a fourth stepped sidewall SW4 of the fourth opening 163D. The first to fourth stepped sidewalls SW1 to SW4 may face in different directions. For example, the first stepped sidewall SW1 may face in the second direction DR2, the second stepped sidewall SW2 may face in the third direction DR3, the third stepped sidewall SW3 may face in a direction opposite to the second direction DR2, and the fourth stepped sidewall SW4 may face in a direction opposite to the third direction DR3.

The first sidewall 1S1, 2S1, 3S1, or 4S1 may be disposed to face a stepped sidewall SW1, SW2, SW3, or SW4 corresponding thereto. The second sidewall 1S2, 2S2, 3S2, or 4S2 and the third sidewall 1S3, 2S3, 3S3, or 4S3 may be disposed between the stepped sidewall SW1, SW2, SW3, or SW4 and the first sidewall 1S1, 2S1, 3S1, or 4S1. The second sidewall 1S2, 2S2, 3S2, or 4S2 may face a third sidewall 1S3, 2S3, 3S3, or 4S3 corresponding thereto. A gradient of each of the first sidewall 1S1, 2S1, 3S1, or 4S1, the second sidewall 1S2, 2S2, 3S2, or 4S2, and the third sidewall 1S3, 2S3, 3S3, or 4S3 may be greater than a gradient of the stepped sidewall SW1, SW2, SW3, or SW4. For example, a gradient θ2 of each of first, second, and third sidewalls 3S1, 3S2, and 3S3 of the third opening 163C may be greater than a gradient θ1 of the third stepped sidewall SW3.

The first stepped sidewall SW1 may be exposed by the second, third, and fourth openings 163B, 163C, and 163D, the second stepped sidewall SW2 may be exposed by the third and fourth openings 163C and 163D, and the third stepped sidewall may be exposed by the fourth opening 163D.

The plurality of first conductive layers 115A are disposed more distant from the center of the first opening 163A as becoming closer to the second stack structure ST2, to form the first stepped sidewall SW1. The plurality of second conductive layers 115B are disposed closer to the center of the second opening 163B as becoming closer to the first stack structure ST1, to form the second stepped sidewall SW2. The plurality of third conductive layers 115C are disposed more distant from the center of the third opening 163C as becoming closer to the fourth stack structure ST4, to form the third stepped sidewall SW3. The plurality of fourth conductive layers 115D are disposed closer to the center of the fourth opening 163D as becoming closer to the third stack structure ST3, to form the fourth stepped sidewall SW4.

FIGS. 10A, 10B, 11, 12A, 12B, 12C, and 12D are views illustrating a manufacturing method of a stepped stack structure in accordance with embodiments of the present disclosure.

Figure 10A:
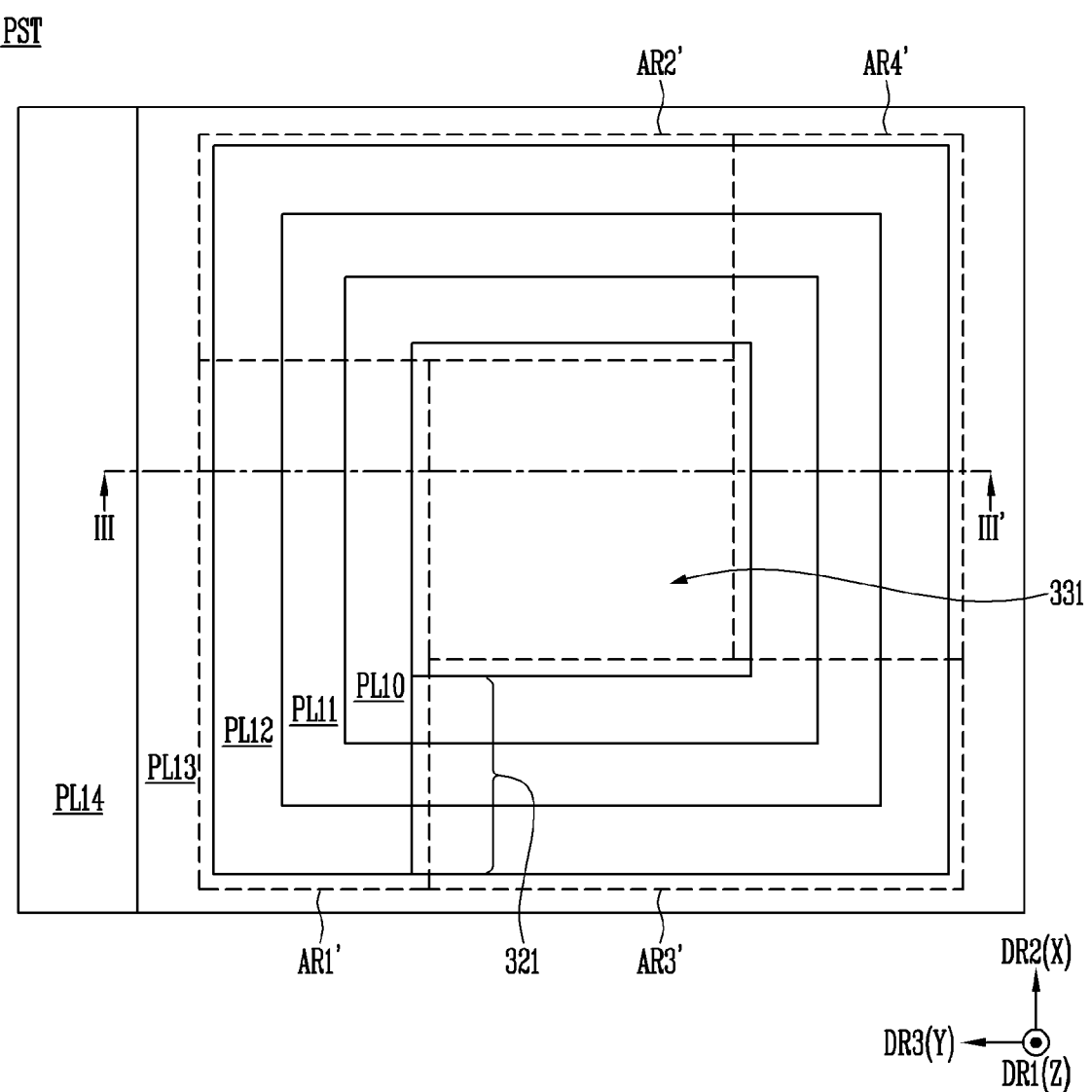
Figure 10B:
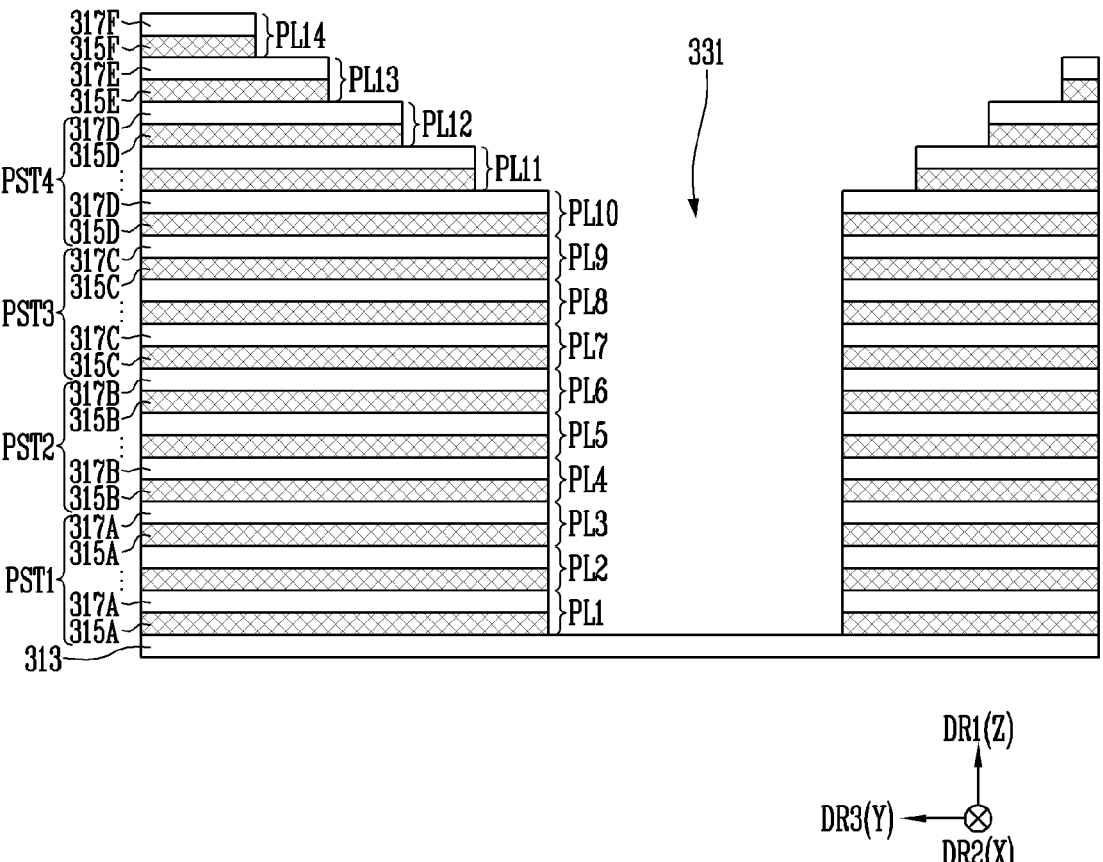
Figure 11:
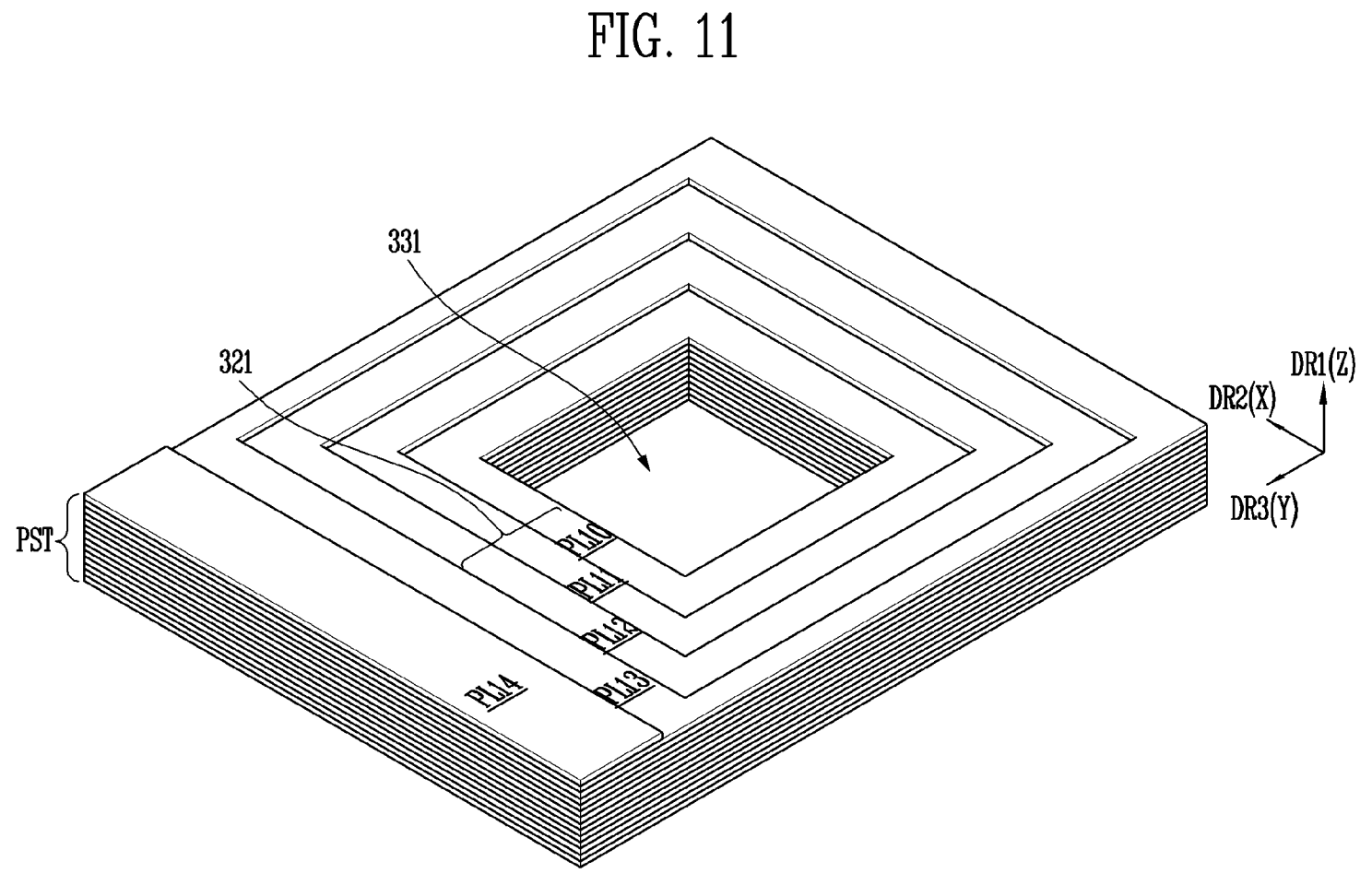

FIG. 10A is a plan view illustrating a preliminary stepped stack structure, FIG. 10B is a sectional view of the preliminary stepped stack structure taken along line III-III' shown in FIG. 10A, and FIG. 11 is a perspective view of the preliminary stepped stack structure.

Referring to FIGS. 10A, 10B, and 11, the preliminary stepped stack structure PST may include an opening 331, and include a plurality of preliminary horizontal layers PL1 to PL14. The plurality of preliminary horizontal layers PL1 to PL14 of the preliminary stepped stack structure PST may have a step difference changed toward the center of the opening 331.

The preliminary stepped stack structure PST may be formed on a first insulating layer 313. The first insulating layer 313 may be formed on a pre-prepared lower structure (not shown). The lower structure may include a peripheral circuit structure and a doped semiconductor structure, or include a sacrificial substrate. Each of the preliminary horizontal layers PL1 to PL14 may extend along the second direction DR2 and the third direction DR3, which intersect each other from a planar viewpoint.

The plurality of preliminary horizontal layers PL1 to PL14 may include a plurality of first preliminary horizontal layers PL1 to PL3 of a first preliminary stack structure PST1, a plurality of second preliminary horizontal layers PL4 to PL6 of a second preliminary stack structure PST2, a plurality of third preliminary horizontal layers PL7 to PL9 of a third preliminary stack structure PST3, a plurality of fourth preliminary horizontal layers PL10 to PL12 of a fourth preliminary stack structure PST4, a fifth preliminary horizontal layer PL13, and a sixth preliminary horizontal layer PL14.

The plurality of preliminary horizontal layers PL1 to PL14 may include a plurality of first material layers 315A to 315F and a plurality of second material layers 317A to 317F, which are alternately disposed in the first direction DR1 on the first insulating layer 313. The plurality of second material layers 317A to 317F may be formed of a material different from a material of the plurality of first material layers 315A to 315F. In an embodiment, each of the plurality of second material layers 317A to 317F may be formed of an insulating material for interlayer insulating layers, and each of the plurality of first material layers 315A to 315F may be formed of a material having an etch selectivity with respect to the plurality of second material layers 317A to 317F. In an embodiment, each of the plurality of second material layers 317A to 317F may include an oxide layer such as silicon oxide, and each of the plurality of first material layers 315A to 315F may include a nitride layer such as silicon nitride. In another embodiment, each of the plurality of second material layers 317A to 317F may be formed of an insulating material for interlayer insulating layers, and each of the plurality of first material layers 315A to 315F may be formed of a conductive material for conductive layers. Hereinafter, the manufacturing method is described based on an embodiment in which the plurality of second material layer 317A to 317F are provided as interlayer insulating layers and the plurality of first material layers 315A to 315F are provided as conductive layers, but the embodiment of the present disclosure is not limited thereto.

The plurality of first material layers 315A to 315F and the plurality of second material layers 317A to 317F may be divided into a plurality of pairs constituting the plurality of preliminary horizontal layers PL1 to PL14. For example, the sixth preliminary horizontal layer PL14 may be configured with a first material layer 315F and a second material layer 317F, which constitute a pair corresponding thereto.

The process of forming the preliminary stepped stack structure PST may include a process of exposing the fifth preliminary horizontal layer PL13 by etching the first material layer 315F and the second material layer 317F of the sixth preliminary horizontal layer PL14, a process of forming the opening 331 penetrating the plurality of first preliminary horizontal layers PL1 from the fifth preliminary horizontal layer PL13 by etching the first to fifth preliminary horizontal layers PL1 to PL13, and a process of forming a stepped structure surrounding the periphery of the opening 331 by using a step etching process.

The step etching process may be performed such that a first sub-stepped structure 321 is formed. The first sub-stepped structure 321 may be defined by an end portion of the plurality of fourth preliminary horizontal layers PL10 to PL12. The fifth preliminary horizontal layer PL13 may be etched to expose the first sub-stepped structure 321.

The end portion of the plurality of fourth preliminary horizontal layers PL10 to PL12 may extend clockwise or counterclockwise, to form the first sub-stepped structure 321 surrounding the periphery of the opening 331. The first sub-stepped structure 321 may include first to fourth regions AR1' to AR4' arranged clockwise or counterclockwise. The first region AR1' may be adjacent to the sixth preliminary horizontal layer PL14. The second region AR2' and the third region AR3' may extend, from the first region AR1, in a direction becoming distant from the sixth preliminary horizontal layer PL14, and face each other. The fourth region AR4' may face the first region AR1'.

Figure 12A:
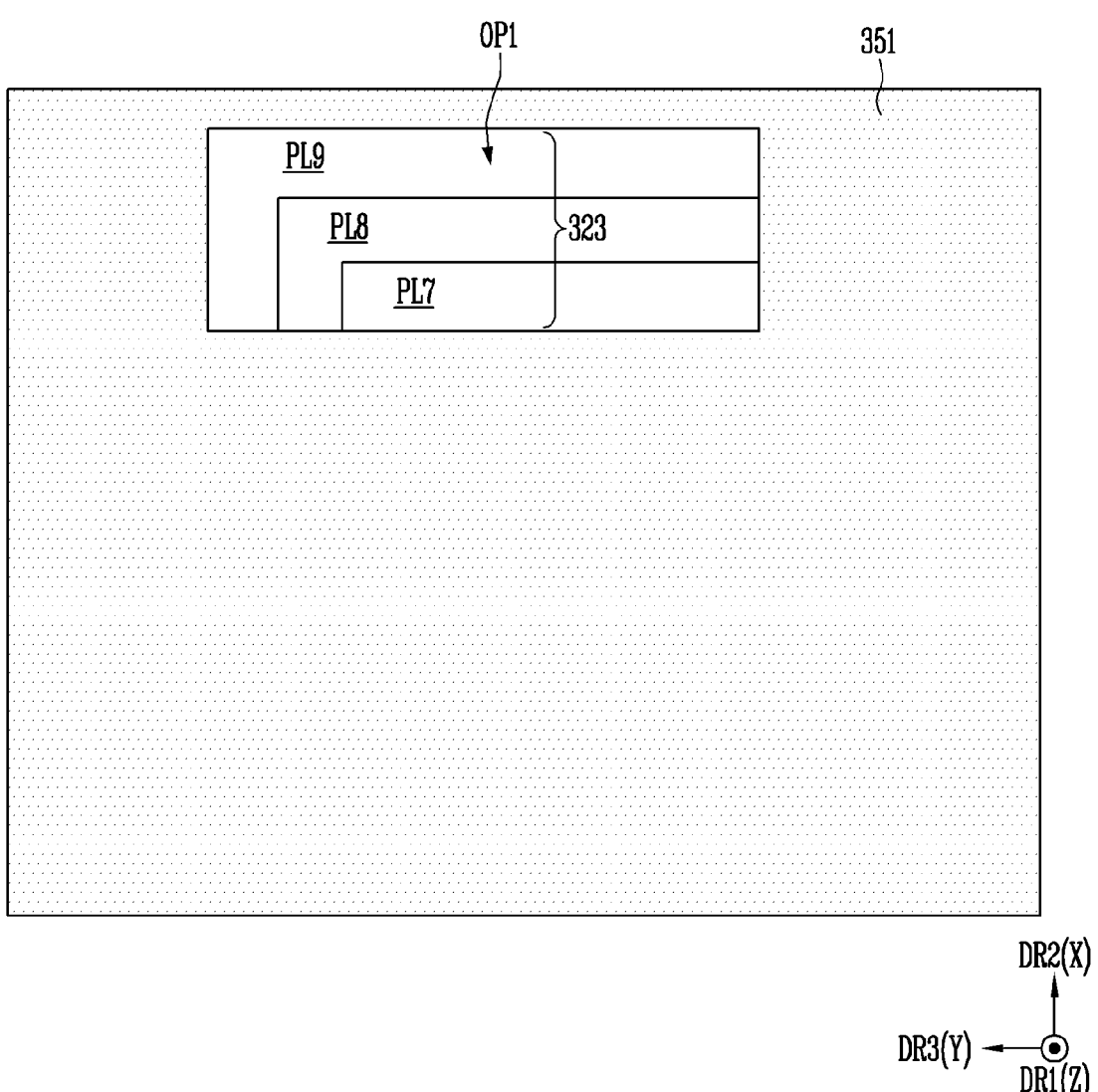

FIG. 12A is a plan view illustrating a process of forming a second sub-stepped structure 323.

Referring to FIG. 12A, a first mask pattern 351 including a first opening region OP1 may be formed on the preliminary stepped stack structure PST described with reference to FIGS. 10A, 10B, and 11. The first opening region OP1 may expose the second region AR2' of the first sub-stepped structure 321 shown in FIG. 10A. Subsequently, the end portion of the plurality of fourth preliminary horizontal layers PL10 to PL12 shown in FIG. 10A may be etched in the second region AR2' of the first sub-stepped structure 321 shown in FIG. 10A. Accordingly, an end portion of the plurality of third preliminary horizontal layers PL7 to PL9 may be exposed, and the second sub-stepped structure 323 may be defined by the end portion of the plurality of third preliminary horizontal layers PL7 to PL9. After the second sub-stepped structure 323 is formed, the first mask pattern 351 may be removed.

Figure 12B:
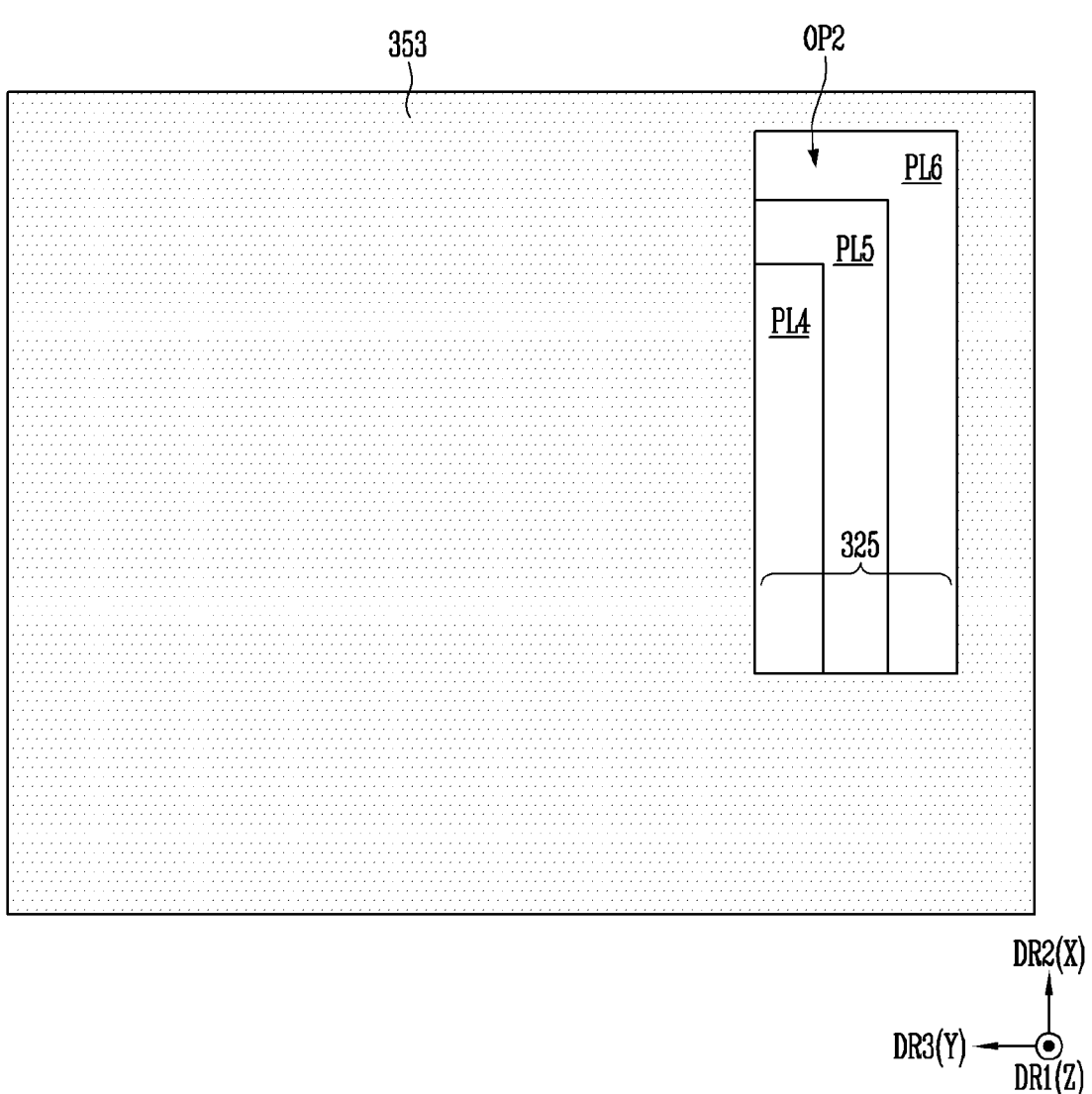

FIG. 12B is a plan view illustrating a process of forming a third sub-stepped structure 325.

Referring to FIG. 12B, a second mask pattern 353 including a second opening region OP2 may be formed on the preliminary stepped stack structure including the second sub-stepped structure 323 shown in FIG. 12A. The second opening region OP2 may expose the fourth region AR4' of the first sub-stepped structure 321 shown in FIG. 10A. Subsequently, the end portion of the plurality of fourth preliminary horizontal layers PL10 to PL12 and the end portion of the plurality of third preliminary horizontal layers PL7 to PL9, which are shown in FIG. 10A, may be etched in the fourth region AR4' of the first sub-stepped structure 321 shown in FIG. 10A. Accordingly, an end portion of the plurality of second preliminary horizontal layers PL4 to PL6 may be exposed, and the third sub-stepped structure 325 may be defined by the end portion of the plurality of second preliminary horizontal layers PL4 to PL6. After the third sub-stepped structure 325 is formed, the second mask pattern 353 may be removed.

Figure 12C:
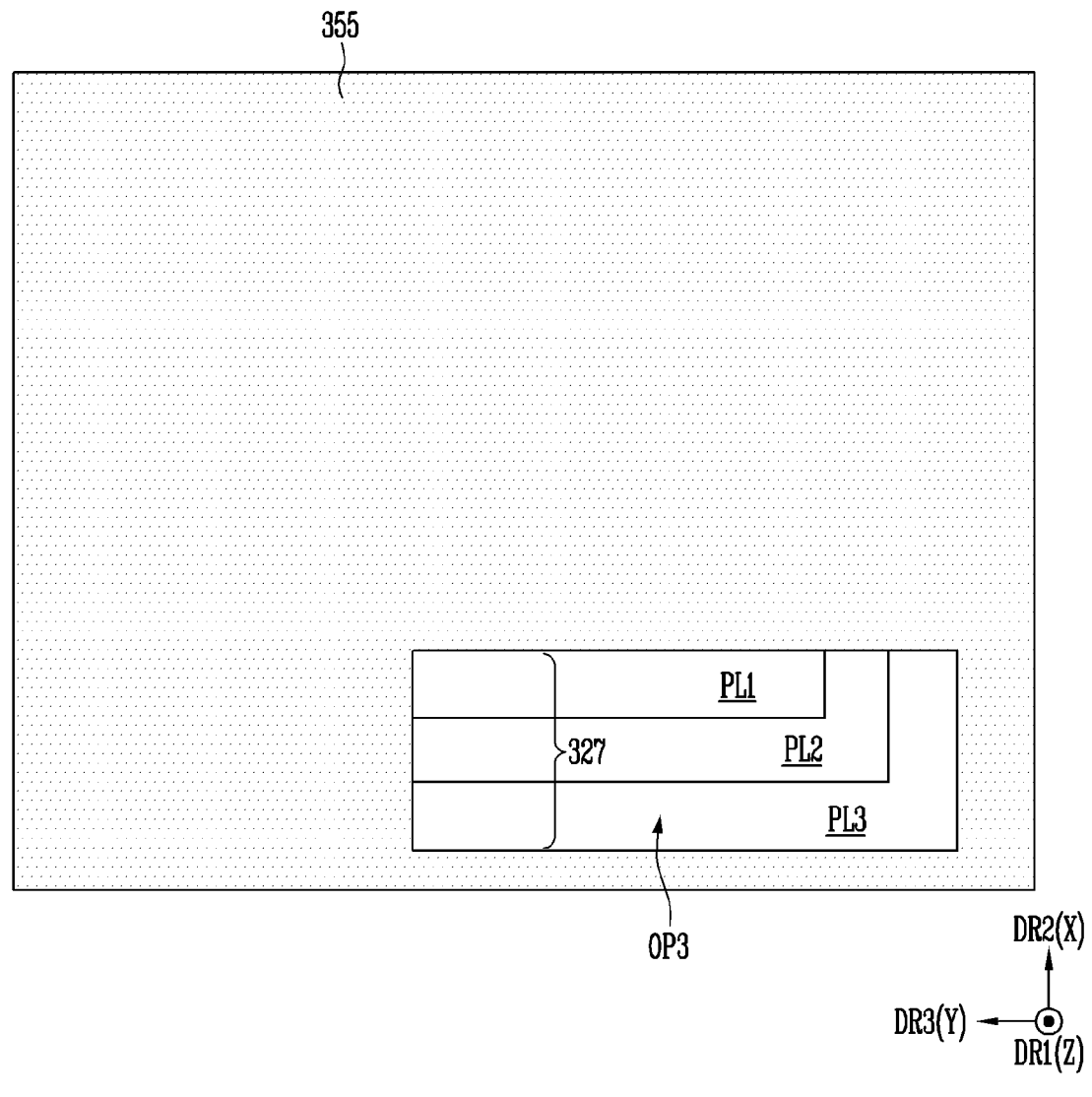

FIG. 12C is a plan view illustrating a process of forming a fourth sub-stepped structure 327.

Referring to FIG. 12C, a third mask pattern 355 including a third opening region OP3 may be formed on the preliminary stepped stack structure including the third sub-stepped structure 325 shown in FIG. 12B. The third opening region OP3 may expose the third region AR3' of the first sub-stepped structure 331 shown in FIG. 10A. Subsequently, the end portion of the plurality of fourth preliminary horizontal layers PL10 to PL12, the end portion of the plurality of third preliminary horizontal layers PL7 to PL9, and the end portion of the plurality of second preliminary horizontal layers PL4 to PL6, which are shown in FIG. 10A, may be etched in the third region AR3' of the first sub-stepped structure 331 shown in FIG. 10A. Accordingly, an end portion of the plurality of first preliminary horizontal layers PL1 to PL3 may be exposed, and the fourth sub-stepped structure 327 may be defined by the end portion of the plurality of first preliminary horizontal layers PL1 to PL3. After the fourth sub-stepped structure 327 is formed, the third mask pattern 355 may be removed.

Figure 12D:
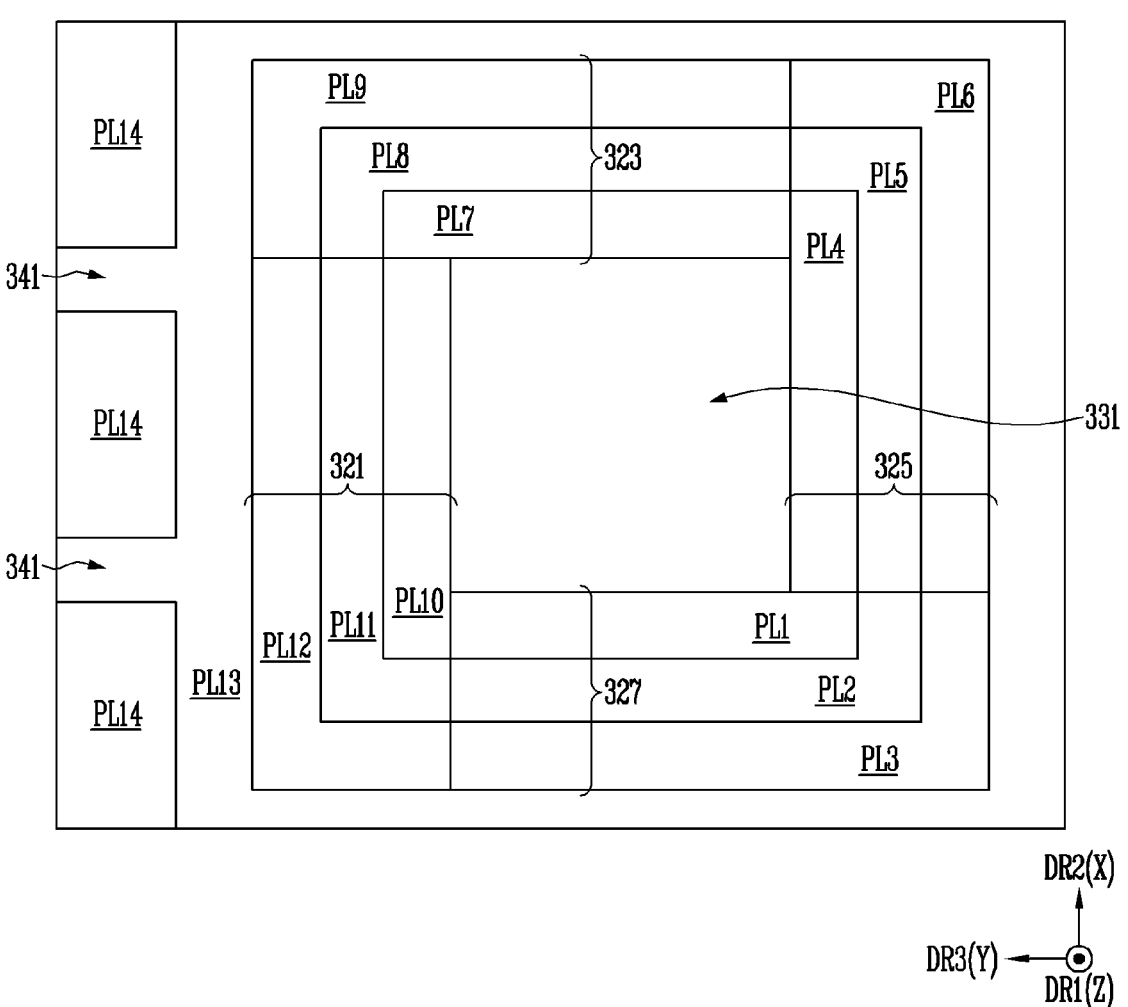

FIG. 12D is a plan view illustrating a process of forming a trench 341.

Referring to FIG. 12D, the sixth preliminary horizontal layer PL14 may be etched, thereby forming the trench 341 penetrating the sixth preliminary horizontal layer PL14. The sixth preliminary horizontal layer PL14 may be isolated into a plurality of line patterns by the trench 341.

When the plurality of first material layers 315A to 315F shown in FIG. 10B are formed of a nitride layer, a replace process for replacing the plurality of first material layers 315A to 315F with a plurality of conductive layers may be performed before the trench 341 is formed.

Subsequently, subsequent processes for forming conductive gate contacts, conductive peripheral circuit contacts, and conductive lines may be performed.

Figure 13A:
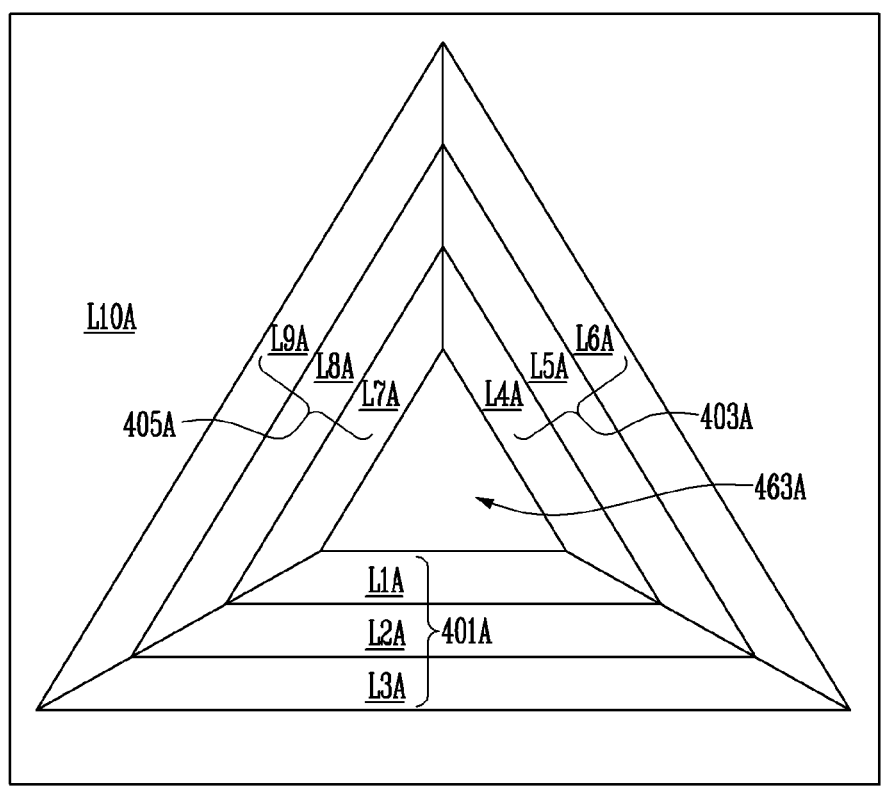
FIGS. 13A and 13B are plan views illustrating a contact region of a gate stack structure in accordance with embodiments of the present disclosure.
Figure 13B:
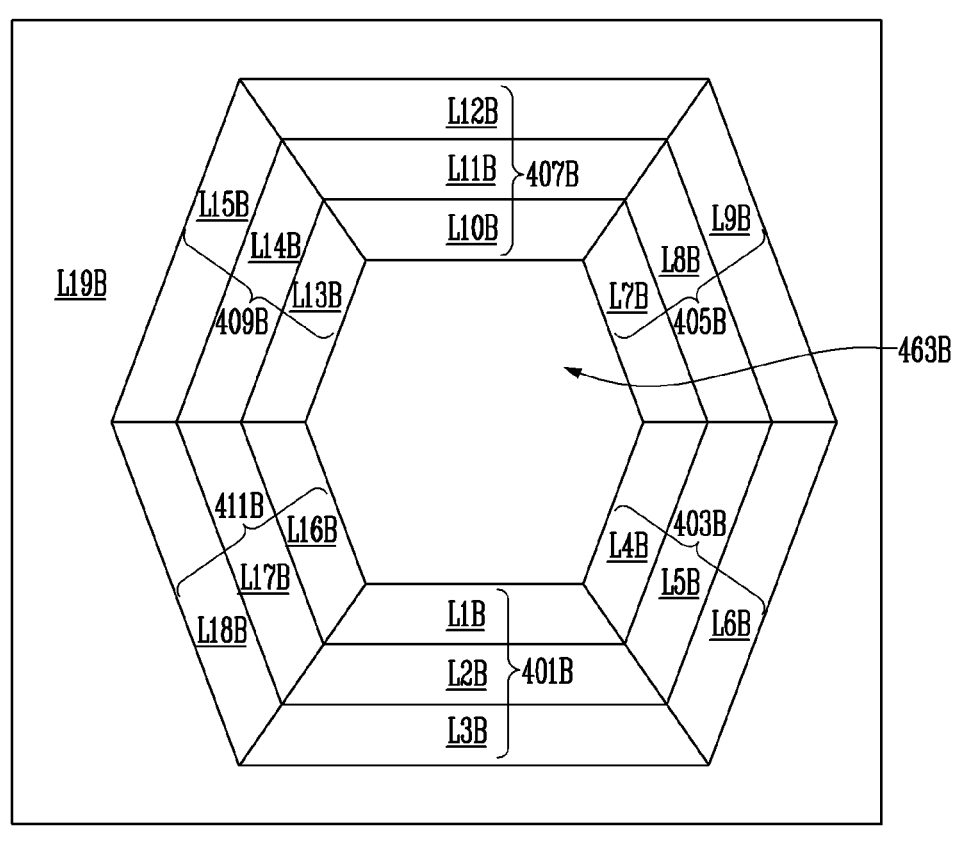

FIGS. 13A and 13B are plan views illustrating a contact region of a gate stack structure in accordance with embodiments of the present disclosure.

Referring to FIG. 13A, a plurality of horizontal layers L1A to L10A stacked in one direction may form a gate stack structure. The plurality of horizontal layers L1A to L10A may form a stepped structure surrounding the periphery of a triangular opening 463A. The plurality of horizontal layers L1A to L10A may include a plurality of first horizontal layers L1A to L3A forming a first sub-stepped structure 401A in a first region, a plurality of second horizontal layers L4A to L6A forming a second sub-stepped structure 403A in a second region, a plurality of third horizontal layers L7A to L9A forming a third sub-stepped structure 405A in a third region, and a fourth horizontal layer L10A surrounding the periphery of the first to third sub-stepped structures 401A, 403A, and 405A.

The first to third sub-stepped structures 401A, 403A, and 405A may become lower as becoming closer to the center of the triangular opening 463A, and be located at different levels. More specifically, the first to third sub-stepped structures 401A, 403A, and 405A may be disposed to have a step difference clockwise or counterclockwise.

Referring to FIG. 13B, a plurality of horizontal layers L1B to L19B stacked in one direction may form a gate stack structure. The plurality of horizontal layers L1B to L19B may form a stepped structure surrounding the periphery of a hexagonal opening 463B. The plurality of horizontal layers L1B to L19B may include a plurality of first to sixth horizontal layers forming first, second, third, fourth, fifth, and sixth stepped structures 401B, 403B, 405B, 407B, 409B, and 411B in first, second, third, fourth, fifth, and sixth regions.

Each of the first sub-stepped structure 401B formed by a plurality of first horizontal layers L1B to L3B, the second sub-stepped structure 403B formed by a plurality of second horizontal layers L4B to L6B, the third sub-stepped structure 405B formed by a plurality of third horizontal layers L7B to L9B, the fourth sub-stepped structure 407B formed by a plurality of fourth horizontal layers L10B to L12B, the fifth sub-stepped structure 409B formed by a plurality of fifth horizontal layers L13B to L15B, and the sixth sub-stepped structure 411B formed by a plurality of sixth horizontal layers L16B to L18B may become lower as becoming closer to the center of the hexagonal opening 463B. The first to sixth sub-stepped structures 401B to 411B may be located at different levels. More specifically, the first to sixth sub-stepped structures 401B to 411B may be arranged to have a step difference clockwise or counterclockwise.

The plurality of horizontal layers LIB to L19B may further include a seventh horizontal layer L19B surrounding the periphery of the first to sixth sub-stepped structures 401B to 411B.

As described above, the gate stack structure in accordance with the embodiments of the present disclosure may include three or more regions arranged clockwise or counterclockwise at the periphery of an opening of a polygon. In accordance with embodiments of the present disclosure, sub-stepped structures may be respectively disposed in the three or more regions, and each of the sub-stepped structures may have a step difference changed toward the center of the opening. Also, the sub-stepped structures may be formed to make a step difference at a boundary between different regions. In accordance with the embodiments of the present disclosure, the area allocated to a dummy stepped structure in the regions surrounding the openings may be removed, and the sub-stepped structures may be used as contact regions of conductive gate contacts involved in an operation of the semiconductor memory device.

Figure 14:
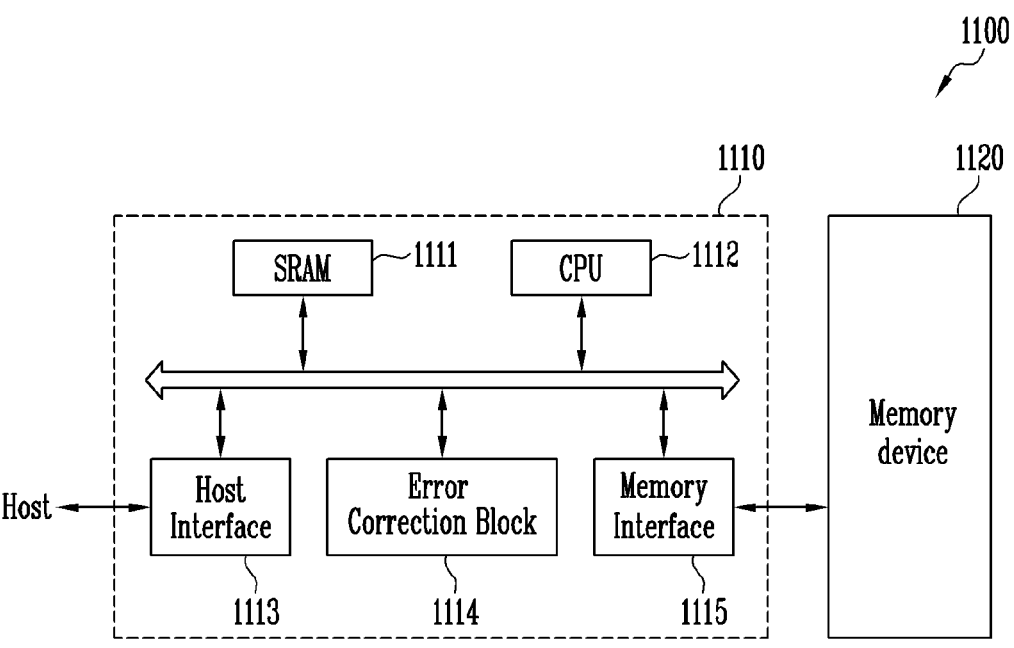
FIG. 14 is a block diagram illustrating a configuration of a memory system in accordance with an embodiment of the present disclosure.

FIG. 14 is a block diagram illustrating a configuration of a memory system in accordance with an embodiment of the present disclosure.

Referring to FIG. 14, a memory system 1100 includes a memory device 1120 and a memory controller 1110.

The memory device 1120 may be a multi-chip package configured with a plurality of flash memory chips. The memory device 1120 may include a plurality of conductive layers stacked while surrounding the periphery of a polygonal opening, and a stepped structure formed along a sidewall of the polygonal opening. The stepped structure may include a plurality of steps which become lower as becoming closer to the center of the polygonal opening and become lowers clockwise or counterclockwise.

The memory controller 1110 controls the memory device 1120. The memory controller 1110 may include Static Random Access Memory (SRAM) 1111, a Central Processing Unit (CPU) 1112, a host interface 1113, an error correction block 1114, and a memory interface 1115. The SRAM 1111 is used as operation memory of the CPU 1112, the CPU 1112 performs overall control operations for data exchange of the memory controller 1110, and the host interface 1113 includes a data exchange protocol for a host connected with the memory system 1100. The error correction block 1114 detects errors included in a data read from the memory device 1120, and corrects the detected error. The memory interface 1115 interfaces with the memory device 1120. The memory controller 1110 may further include Read Only Memory (ROM) for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory system 1100 may communicated with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

Figure 15:
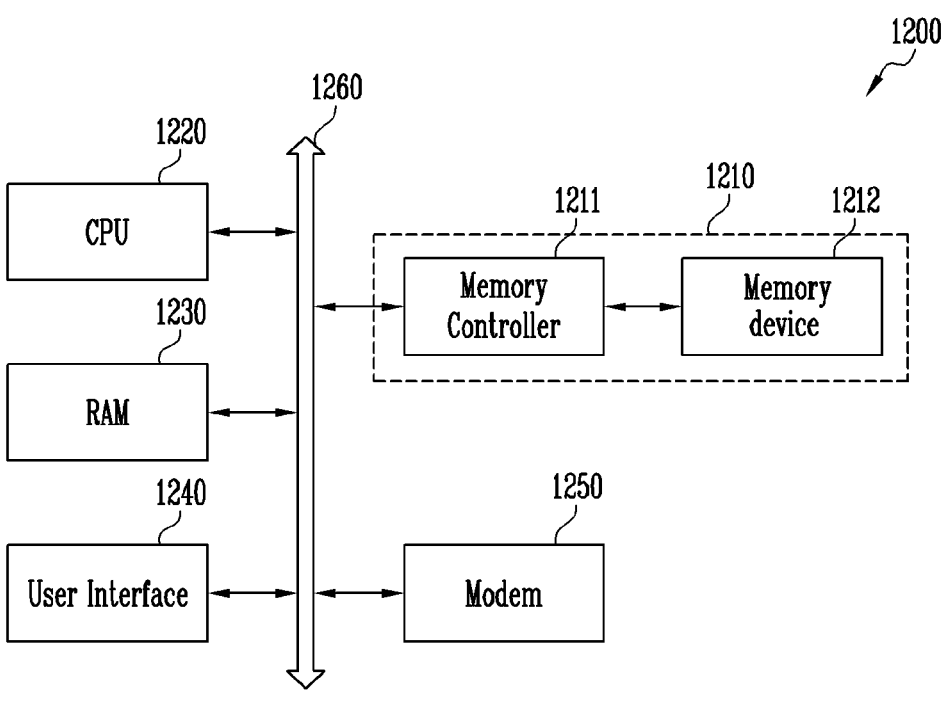
FIG. 15 is a block diagram illustrating a configuration of a computing system in accordance with an embodiment of the present disclosure.

FIG. 15 is a block diagram illustrating a configuration of a computing system in accordance with an embodiment of the present disclosure.

Referring to FIG. 15, a computing system 1200 may include a CPU 1220, random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, an image processor, mobile DRAM, and the like may be further included.

The memory system 1210 may be configured with a memory device 1212 and a memory controller 1211. The memory device 1212 may have the same configuration as the memory device 1120 described above with reference to FIG. 14. The memory controller 1211 may have the same configuration as the memory controller 1110 described above with reference to FIG. 14.

In accordance with embodiments of the present disclosure, a sidewall of a gate stack structure surrounding the periphery of an opening of the gate stack structure has a step difference changed clockwise or counterclockwise. Accordingly, the area for a stepped structure may be efficiently used from a planar viewpoint, and the area allocated to the stepped structure may be reduced. Thus, the degree of integration of the semiconductor memory device may be improved.

What is claimed is:

1. A semiconductor memory device comprising:

a gate stack structure including a cell array region, a first region adjacent to the cell array region, second and third regions which extend from the first region in a direction away from the cell array region and the second and third regions and the third region face each other, and a fourth region which faces the first region and connects the second region to the third region;

a first sub-stepped structure disposed in the first region of the gate stack structure;

a second sub-stepped structure disposed in the second region of the gate stack structure;

a third sub-stepped structure disposed in the third region of the gate stack structure; and a fourth sub-stepped structure disposed in the fourth region of the gate stack structure, wherein the first, second, third, and fourth sub-stepped structures are disposed at different levels in a first direction.

2. The semiconductor memory device of claim 1, wherein the gate stack structure includes an opening surrounded by the first, second, third, and fourth regions, and wherein each of the first, second, third, and fourth sub-stepped structures becomes lower with closer distance to the center of the opening.

3. The semiconductor memory device of claim 1, wherein the gate stack structure includes:

a first stack structure including a plurality of first conductive layers stacked to be spaced apart from each other in the first direction, the plurality of first conductive layers extending to the first, second, third, and fourth regions from the cell array region;

a second stack structure including a plurality of second conductive layers stacked on the first stack structure to be spaced apart from each other in the first direction, the plurality of second conductive layers extending to the first region, the second region, and the fourth region from the cell array region;

a third stack structure including a plurality of third conductive layers stacked on the second stack structure to be spaced apart from each other in the first direction, the plurality of third conductive layers extending to the first and second regions from the cell array region; and a fourth stack structure including a plurality of fourth conductive layers stacked on the third stack structure to be spaced apart from each other in the first direction, the fourth stack structure extending to the first region from the cell array region.

4. The semiconductor memory device of claim 3, wherein the first sub-stepped structure is defined by an end portion of the plurality of fourth conductive layers, and becomes lower with increasing distance from the cell array region.

5. The semiconductor memory device of claim 3, wherein the second sub-stepped structure is defined by an end portion of the plurality of third conductive layers and becomes lower with decreasing distance to the third region.

6. The semiconductor memory device of claim 3, wherein the third sub-stepped structure is defined by an end portion of the plurality of first conductive layers and becomes lower with decreasing distance to the second region.

7. The semiconductor memory device of claim 3, wherein the fourth sub-stepped structure is defined by an end portion of the plurality of second conductive layers and becomes lower with decreasing distance to the first region.

8. The semiconductor memory device of claim 1, further comprising:

a plurality of conductive gate contacts extending in the first direction from the first sub-stepped structure, the second sub-stepped structure, the third sub-stepped structure, and the fourth sub-stepped structure;

a plurality of conductive peripheral circuit contacts disposed in an opening of the gate stack structure surrounded by the first, second, third, and fourth regions; and a plurality of conductive lines connecting the plurality of conductive gate contacts to the plurality of conductive peripheral circuit contacts.

9. A semiconductor memory device comprising:

a first stack structure including a plurality of first conductive layers stacked to be spaced apart from each other in a first direction, the plurality of first conductive layers surrounding a first opening;

a second stack structure including a plurality of second conductive layers stacked on the first stack structure to be spaced apart from each other in the first direction, the plurality of second conductive layers surrounding a second opening;

a third stack structure including a plurality of third conductive layers stacked on the second stack structure to be spaced apart from each other in the first direction, the plurality of third conductive layers surrounding a third opening; and a fourth stack structure including a plurality of fourth conductive layers stacked on the third stack structure to be spaced apart from each other in the first direction, the plurality of fourth conductive layers surrounding a fourth opening, wherein each of the first, second, third, and fourth openings includes a stepped sidewall, a first sidewall facing the stepped sidewall, and second and third sidewalls which are disposed between the first sidewall and the stepped sidewall and face each other, and wherein a gradient of each of the first, second, and third sidewalls is greater than a gradient of the stepped sidewall.

10. The semiconductor memory device of claim 9, wherein the plurality of first, second, third, and fourth conductive layers extend in a second direction and a third direction, which intersect each other from a planar viewpoint, and wherein the stepped sidewall includes a first stepped sidewall of the first opening, a second stepped sidewall of the second opening, a third stepped sidewall of the third opening, and a fourth stepped sidewall of the fourth opening.

11. The semiconductor memory device of claim 10, wherein the first stepped sidewall faces in the second direction, the third stepped sidewall faces in a direction opposite to the second direction, the second stepped sidewall faces in the third direction, and the fourth stepped sidewall faces in a direction opposite to the third direction.

12. The semiconductor memory device of claim 10, wherein the first stepped sidewall is exposed by the second, third, and fourth openings, the second stepped sidewall is exposed by the third and fourth openings, and the third stepped sidewall is exposed by the fourth opening.

13. The semiconductor memory device of claim 10, wherein the plurality of first conductive layers are disposed more distant from the center of the first opening with decreasing distance to the second stack structure, wherein the plurality of second conductive layers are disposed closer to the center of the second opening with decreasing distance to the first stack structure, wherein the plurality of third conductive layers are disposed more distant from the center of the third opening with decreasing distance to the fourth stack structure, and wherein the plurality of fourth conductive layers are disposed closer to the center of the fourth opening with decreasing distance to the third stack structure.

14. The semiconductor memory device of claim 10, further comprising:

a plurality of conductive gate contacts respectively connected to the plurality of first conductive layers, the plurality of second conductive layers, the plurality of third conductive layers, and the plurality of fourth conductive layers, the plurality of conductive gate contacts extending in the first direction;

a plurality of conductive peripheral circuit contacts disposed in a region in which the first, second, third, and fourth openings overlap with each other; and a plurality of conductive lines connecting the plurality of conductive peripheral circuit contacts to the plurality of conductive gate contacts.

15. A semiconductor memory device comprising:

a gate stack structure including a plurality of conductive layers stacked to be spaced apart from each other in a first direction, the gate stack structure surrounding a periphery of a polygonal opening; and a stepped structure formed along a sidewall of the polygonal opening, wherein, from a planar viewpoint, the stepped structure becomes lower with decreasing distance to the center of the polygonal opening, and becomes lower clockwise or counterclockwise.

16. A semiconductor memory device comprising:

a plurality of conductive layers stacked to be spaced apart from each other in a first direction, the plurality of conductive layers connected to a memory cell array; and a stepped structure including a plurality of end portions of the plurality of conductive layers, the stepped structure continuously extending to surround an opening, wherein the stepped structure includes a first sub-stepped structure and a second sub-stepped structure adjacent to each other clockwise, wherein the plurality of conductive layers include lower conductive layers stacked to be spaced apart from each other in the first direction and upper conductive layers stacked over the lower conductive layers to be spaced apart from each other in the first direction, wherein the first sub-stepped structure includes first end portions of the upper conductive layers, wherein the second sub-stepped structure includes second end portions of the lower conductive layers, and wherein the first end portions and the second end portions are disposed at different levels in the first direction.

17. The semiconductor memory device of claim 16, wherein a lowermost first end portion among the first end portions and an uppermost second end portion among the second end portions are disposed at different levels in the first direction to define a step.

*    *    *    *    *